US010522300B2

United States Patent
Yang

(10) Patent No.: US 10,522,300 B2
(45) Date of Patent: Dec. 31, 2019

(54) METALLIC SURFACE WITH KARSTIFIED RELIEF, FORMING SAME, AND HIGH SURFACE AREA METALLIC ELECTROCHEMICAL INTERFACE

(71) Applicant: NATIONAL RESEARCH COUNCIL OF CANADA, Ottawa (CA)

(72) Inventor: Dongfang Yang, London (CA)

(73) Assignee: National Research Council of Canada, Ottawa (CA)

( * ) Notice: Subject to any disclaimer, the term of this patent is extended or adjusted under 35 U.S.C. 154(b) by 460 days.

(21) Appl. No.: 15/165,584

(22) Filed: May 26, 2016

(65) Prior Publication Data
US 2016/0380259 A1 Dec. 29, 2016

Related U.S. Application Data

(60) Provisional application No. 62/166,407, filed on May 26, 2015.

(51) Int. Cl.
*B21D 39/00* (2006.01)
*H01G 11/24* (2013.01)
(Continued)

(52) U.S. Cl.
CPC ......... *H01G 11/24* (2013.01); *B23K 26/0006* (2013.01); *B23K 26/0624* (2015.10);
(Continued)

(58) Field of Classification Search
None
See application file for complete search history.

(56) References Cited

U.S. PATENT DOCUMENTS 4,987,007 A  1/1991  Wagal et al.
5,733,178 A * 3/1998  Ohishi ............... B24D 11/00
                                                              451/41
(Continued)

FOREIGN PATENT DOCUMENTS

EP   2431120 A1   3/2012
EP   2525377 A1   11/2012
(Continued)

OTHER PUBLICATIONS

Ehrhardt, Martin et al. (2013) Laser Embossing of Self-Organized Nanostructures into Metal Surfaces by KrF Laser Irradiation, Journal of Laser Micro/Nanoengineering, 8(1):85-89.
(Continued)

*Primary Examiner* — Seth Dumbris
(74) *Attorney, Agent, or Firm* — Jessica Smith

(57) ABSTRACT

A metal foil with a karstified topography having a surface morphology in which a maximum peak height minus a maximum profile depth is greater than 0.5 μm and extends into the surface at least 5% of the foil thickness, a root mean square roughness is at least about 0.2 μm measured in a direction of greatest roughness, and an oxygen abundance is less than 5 atomic %. The foil may be composed of aluminum, titanium, nickel, copper, or stainless steel, or an alloy of any thereof, and may have a coating composed of nickel, nickel alloy, titanium, titanium alloy, nickel oxide, titanium dioxide, zinc oxide, indium tin oxide, or carbon, or a mixture or composite of any thereof. The foil may form part of a metal electrode, current collector, or electrochemical interface. Further described is a method for producing the foil by laser ablation in a vacuum.

30 Claims, 8 Drawing Sheets

(51) Int. Cl.

| | |
|---|---|
| *B23K 26/352* | (2014.01) |
| *C23C 14/08* | (2006.01) |
| *C23C 14/06* | (2006.01) |
| *C23C 14/28* | (2006.01) |
| *B23K 26/0622* | (2014.01) |
| *B23K 26/08* | (2014.01) |
| *H01M 4/04* | (2006.01) |
| *H01M 4/136* | (2010.01) |
| *H01M 4/1391* | (2010.01) |
| *H01M 4/66* | (2006.01) |
| *H01M 4/78* | (2006.01) |
| *H01M 4/80* | (2006.01) |
| *C23C 14/02* | (2006.01) |
| *H01G 11/26* | (2013.01) |
| *H01G 11/70* | (2013.01) |
| *B23K 26/00* | (2014.01) |
| *B23K 26/12* | (2014.01) |
| *H01G 11/32* | (2013.01) |
| *H01G 11/46* | (2013.01) |
| *B23K 101/38* | (2006.01) |
| *B23K 103/04* | (2006.01) |
| *B23K 103/10* | (2006.01) |
| *B23K 101/36* | (2006.01) |
| *B23K 103/12* | (2006.01) |
| *B23K 103/14* | (2006.01) |
| *B23K 103/18* | (2006.01) |

(52) U.S. Cl.
CPC ...... *B23K 26/0823* (2013.01); *B23K 26/0846* (2013.01); *B23K 26/0876* (2013.01); *B23K 26/127* (2013.01); *B23K 26/1224* (2015.10); *B23K 26/352* (2015.10); *B23K 26/355* (2018.08); *B23K 26/3568* (2018.08); *C23C 14/028* (2013.01); *C23C 14/0605* (2013.01); *C23C 14/08* (2013.01); *C23C 14/28* (2013.01); *H01G 11/26* (2013.01); *H01G 11/70* (2013.01); *H01M 4/0404* (2013.01); *H01M 4/0423* (2013.01); *H01M 4/0426* (2013.01); *H01M 4/136* (2013.01); *H01M 4/1391* (2013.01); *H01M 4/661* (2013.01); *H01M 4/78* (2013.01); *H01M 4/80* (2013.01); *B23K 2101/36* (2018.08); *B23K 2101/38* (2018.08); *B23K 2103/05* (2018.08); *B23K 2103/10* (2018.08); *B23K 2103/12* (2018.08); *B23K 2103/14* (2018.08); *B23K 2103/26* (2018.08); *H01G 11/32* (2013.01); *H01G 11/46* (2013.01); *Y02E 60/13* (2013.01); *Y10T 428/12431* (2015.01); *Y10T 428/12472* (2015.01)

(56) References Cited

U.S. PATENT DOCUMENTS

| | | | |
|---|---|---|---|
| 6,372,103 B1 | 4/2002 | Perry et al. | |
| 6,419,149 B1* | 7/2002 | Yano | B23K 20/02 228/235.1 |
| 6,475,638 B1* | 11/2002 | Mitsuhashi | C25D 1/04 174/256 |
| 6,964,884 B1* | 11/2005 | Chan | H05K 3/383 361/761 |
| 7,425,172 B2 | 9/2008 | Misra et al. | |
| 7,557,367 B2 | 7/2009 | Rogers et al. | |
| 7,678,443 B2 | 3/2010 | Schulz et al. | |
| 7,867,688 B2 | 1/2011 | Phillips et al. | |
| 8,025,831 B2 | 9/2011 | Kong et al. | |
| 8,333,810 B1 | 12/2012 | Meyyappan | |
| 8,399,798 B2 | 3/2013 | Stahr | |
| 8,472,163 B2 | 6/2013 | Kazaryan et al. | |
| 2003/0017658 A1 | 1/2003 | Nishitani et al. | |
| 2004/0112104 A1* | 6/2004 | Scamans | B21B 1/227 72/187 |
| 2004/0141282 A1 | 7/2004 | Hudis | |
| 2006/0110898 A1* | 5/2006 | Lauffer | H01L 21/4857 438/584 |
| 2006/0292384 A1 | 12/2006 | Kazaryan et al. | |
| 2009/0047539 A1* | 2/2009 | Dobashi | C25D 1/04 428/607 |
| 2010/0196624 A1 | 8/2010 | Ruuttu et al. | |
| 2011/0024400 A1 | 2/2011 | Rumsby | |
| 2011/0284110 A1 | 11/2011 | Gagnon | |
| 2013/0142994 A1* | 6/2013 | Wang | C03C 15/00 428/141 |

FOREIGN PATENT DOCUMENTS

| | | |
|---|---|---|
| KR | 20090108528 A | 10/2009 |
| WO | 00/19465 A1 | 4/2000 |
| WO | 2007/116244 A2 | 10/2007 |
| WO | 2008/103681 A1 | 8/2008 |
| WO | 2012/156809 A1 | 3/2012 |

OTHER PUBLICATIONS

Xu, Sheng et al, (2011) One-dimensional ZnO Nanostructures: Solution Growth and Functional Properties. Nano Res. 4:1013.

Portet, C., P. L. Taberna, et al. (2006). "Modification of Al current collectoilactive material interface for power improvement of electrochemical capacitor electrodes." Journal of the Electrochemical Society 153(4): A649-53.

Portet, C., P. L. Taberna, et al. (2004). "Modification of Al current collector surface by sol-gel deposit for carbon-carbon supercapacitor applications." Electrochimica Acta 49(6): 905-912.

Taberna, P. L., C. Portet, et al. (2006). "Electrode surface treatment and electrochemical impedance spectroscopy study on carbon/carbon supercapacitors." Applied Physics A: Materials Science and Processing 82(4 SPEC. ISS): 639-646.

Hsien-Chang, W., L. Yen-Po, et al. (2009). "High-performance carbon-based supercapacitors using Al current-collector with conformal carbon coating." Materials Chemistry and Physics 117(1): 294-300.

Zhang, B.-h., G.-x. Zhang, et al. (2007). "Influence of modified current collector on double layer capacitor." Chinese Journal of Power Sources 31(7): 538-41.

Yoon, Y. I., K. M. Kim, et al. (2008). "Effect of nickel foam current collector on the supercapacitive properties of cobalt oxide electrode." Journal of the Korean Ceramic Society 45(6): 368-373.

Chang, J. K., S. H. Hsu, et al. (2008). "A novel electrochemical process to prepare a high-porosity manganese oxide electrode with promising pseudocapacitive performance." Journal of Power Sources 177(2): 676-680.

* cited by examiner

Assembled cell

METALLIC SURFACE WITH KARSTIFIED RELIEF, FORMING SAME, AND HIGH SURFACE AREA METALLIC ELECTROCHEMICAL INTERFACE

FIELD OF THE INVENTION

The present invention relates in general to application of surface morphology to metallic foils, and in particular to a technique for producing karstified relief on metallic foils, such as foils of Al, Cu, or Stainless Steel for use in current collectors, electrodes and like electrochemical interfaces, such as those used in energy storage devices such as batteries, and supercapacitors.

BACKGROUND OF THE INVENTION

One of the strategies to increase the power density of supercapacitors is the optimization of the interface between active material and current collectors, electrodes, or electrochemical interfaces, which are referred to herein as electrode surfaces. Herein a current collector is a thin film that is electrically connected to a larger conductive body to promote interaction between the conductive body and an active material, the conductive body and current collector forming an electrode. An electrode or electrochemical interface may be karstified without any obviously separate or separable current collector. As far as the contact impedance between the active materials and the electrode surfaces can be reduced, improvements can be obtained. It is well known in the art that the ability to collect electrical charge from active materials is a function of surface area of the electrode surface. It has been suggested to increase a surface area of current collectors using nanoporous substrates (see Chang, J. K., S. H. Hsu, et al. (2008) "A novel electrochemical process to prepare a high porosity manganese oxide electrode with promising pseudo capacitive performance" Journal of Power Sources 177(2): 676-680 and Yoon, Y. I., K. M. Kim, et al. (2008) "Effect of nickel foam current collector on the supercapacitive properties of cobalt oxide electrode" Journal of the Korean Ceramic Society 45(6): 368-373). Other methods for surface treatment of metallic electrode surfaces include growing porous carbon films and carbon nanotube brushes on various metallic current collectors to serve as substrates for deposition of active material. Such nano-architectured electrodes may be expected to outperform untreated electrode surfaces, but they are more expensive.

It is known in the art to use chemical etching to remove oxides and develop pitting corrosion, and then applying a conductive carbonaceous material, for example by sol-gel (see Portet, C., P. L. Taberna, et al. (2006) "Modification of Al current collector/active material interface for power improvement of electrochemical capacitor electrodes" Journal of the Electrochemical Society 153(4): A649-53), and to apply a conformal carbon layer onto porous aluminum by a chemical vapour deposition, where the deposition itself removes an oxide layer, replacing it with an interfacial layer of $Al_4C_3$ (see Hsien-Chang, W., L. Yen-Po, et al. (2009) "High-performance carbon-based supercapacitors using Al current-collector with conformal carbon coating" Materials Chemistry and Physics 117(1): 294-300). Activated carbon-based supercapacitors with carbon-coated aluminum current collectors have exhibited remarkable performance.

Conductive zinc films have been deposited on the surface of Al foils to improve performance of the foils as current collectors (see Zhang, B.-h., G.-x. Zhang, et al. (2007) "Influence of modified current collector on double layer capacitor" Chinese Journal of Power Sources 31 (7): 538-41). These results also show that the modified current collectors can significantly reduce the resistance between current collector and electrode active materials and improve the utilization of electrode active materials.

The desire for high surface area current collectors is equally useful for other capacitor electrodes, and electrochemical cells, for example, as noted by WO 00/19465 to Jerabek et al. Specifically Jerabek et al. notes that surface etching and other roughening procedures can be used to enlarge the contact area, but warns that the permanence of a treated current collector is an issue in device longevity since the electrode surface can become chemically transformed, as with an oxide or can react with electrode or electrolyte to form a barrier. Jerabek et al. teaches coating a solid, non-porous, current collector, nominally of aluminum but could also be copper or steel, with a protective coating consisting of a metal nitride, boride or carbide, to prevent an oxide from developing at the interface with the electrode active materials. The coating of the collector can be made by reactive sputter deposition in a vacuum, conventional sputter deposition, evaporation, reactive evaporation, molecular beam deposition processes, and any of a host of other plasma or energy-enhanced deposition processes in vacuum.

Similarly, EP 2525377 to Yuriy et al. appears to teach use of ion bombardment or plasma for removing an oxide layer and to roughen an Al foil. Translated from French by Google translate, Yuriy teaches: [0009] "The use of on cannon or high frequency plasma generator allows: to eliminate the native oxide and eventual pollution of the surface of the aluminum foil film, and increase primary roughness of this surface," An abstract of Yuriy et a from corresponding WO 20121156809 indicates that a method for manufacturing a current collector for a supercapacitor comprises processing a surface of an aluminium foil in a vacuum chamber, including removing a native oxide film and applying a current-conducting coating, said current-conducting coating comprising an outer layer consisting of carbon deposited by sputtering a powder mix of carbon and aluminium onto the aluminium foil.

Aluminum is one of the most common materials for electrode surfaces used in energy storage devices such as supercapacitors and Li-ion batteries (as well as other electrochemical cells) due to its light weight, low cost and high electrical conductivity, however, aluminum oxidizes very quickly in air, and particularly in aqueous electrolyte solutions or in organic electrolyte with water impurity, to form an insulating layer that is typically about a few nanometer thick, known as a native oxide film. There is further concern, as noted in Jerabek et al. that in operation, especially if an aqueous electrolyte is used, the oxidation layer may continue to grow and decrease performance of the aqueous electrolyte based supercapacitor.

Unfortunately, the chemical etching techniques available today to pattern metallic foils are problematic in many ways. There are environmental issues with chemical etching, and reproducibility is also an issue. Importantly, residual etch, reactants, and byproducts are of concern for long term cyclic stability of the interface between the electrode surface and electrode active materials. Plasma or ion gun etching suggested by Yuriy et al. will effectively remove a native oxide film in preparation for deposition of a current-conducting carbon coating, but this etching will not substantially increase a surface area of the surface, unless a high spatial focus is applied to the beam (which runs counter to the purpose of removing the native oxide film), and the beam dwells on etch points an inordinately long duration (at least several hours) to achieve a few micrometer etching depth. Chemical etchants typically remove layers with limited ability to control surface quality/roughness and so they do not tend to produce deep and controllable etching patterns. Etching chemicals, temperature and time are key influential factors on surface finish quality during chemical etching. Therefore a need remains for producing deep patterns with controlled morphology into foil surfaces; producing the deep patterns with high spatial variation in depth, like in naturally karstified structures (referred to herein as karstification and its word forms). Karstified morphology is denotes patterns that result in higher surface areas than conventional surface roughening, and etching can produce. Metal foils with deep patterns and controlled morphology can be used as current collectors, especially if the electrode active material has a form that matches the foil surface morphology allowing for intimate contact of the electrode active material over a great surface area. The form naturally depends on particle size and shape, as well as distributions thereof.

There is further a need for thin film coatings to protect aluminum current collectors, electrodes, etc. from surface oxidation and the resultant formation of electrical insulation at the electrode active material—current collector interface. The coatings need to be electrically conductive, nonreactive with active materials, and corrosion resistant in the intended electrochemical environment. The need is particularly important for electrochemical cells (supercapacitors and batteries) using aqueous electrolyte or corrosive salts in organic electrolytes.

In an unrelated field of technology, pulsed laser deposition has been developed to produce an Al coating onto a desired surface in a high vacuum by ablating a target, such as a thick block of Al. It had previously been observed by Applicant that pulsed laser deposition creates highly irregular surfaces on the target (i.e. the Al block). There has been little report of this, but Stephen R. Foltyn ("Surface modification of materials by cumulative laser irradiation", Chapter 4, of the book entitled "Pulsed Laser Deposition of Thin Film", edit by Douglas B. Chrisey and Graham K. Hubler, A Wiley-Interscience publication, 1994) does teach the generation of laser cones in laser irradiating single-crystal $Al_2O_3$ at 266 nm, and indicates quite generally that "By the early 1980s ripple patterns, now known as laser-induced periodic surface structures (LIPSS), had been produced in metals, semiconductors, and dielectrics". The reference shows ceramic cones that have diameters at base around 10-20 µm and a height of at least twice that. The reference does not teach that such structures can be produced on metallic foils or a use as an electrochemical interface, or current collector.

SUMMARY OF THE INVENTION

Applicant made the unexpected discovery that pulsed laser ablation of thin metallic surfaces can be performed in a vacuum thin, and doing so karstifies the surface. The metallic surface may be of a thin foils, and karstification does not destroy the foil. Applicant has found the surface to have a depth (i.e. a difference between maximum depth and maximum peak height) greater than 200 nm, and more preferably 2.5 µm or more preferably 5 to 100 µm, which should be at least 5% and not more than 70% of a thickness of the karstified foil. The surface may have micron-scale or sub-micron-scale surface roughening with root mean square roughness in the range of 0.05 to 100 µm, more preferably 0.1 to 50 µm, 0.2 to 20 µm, or 0.4 to 10 µm. A resulting surface area may be 50-1000× or more that of the original surface area. A mean depth of the etching was controlled to be about 5-100 µm for a variety of examples by variation of the ablation parameters. Applicant has further found that karstified thin metallic foils can serve as high surface area current collectors used for electrodes, karstification can be beneficial for electrodes and in electrochemical cells, and metals can be efficiently karstified by vacuum laser ablation.

Coating a karstified metal surface with a metal (e.g. Ni, Ti), carbon (including graphite, pyrolytic graphite, graphene and other forms of carbon), a carbon metal composite, an alloy or mixture of metals (e.g., Ni alloys, Ti alloys, and mixtures of C with metals), metal oxides (e.g. nickel oxide; titanium dioxide; zinc oxide and indium tin oxide (ITO)), or a combination thereof, can provide a barrier coating on the foil that prevents oxidation, even when exposed to an aqueous electrolyte, for example in supercapacitor cells. The coating may be deposited by physical vapour deposition (PVD), such as: cathodic arc deposition, electron beam PVD, evaporative deposition, pulsed laser deposition or sputtering; or chemical vapour deposition (CVD), such as: atmospheric pressure CVD, low pressure CVD, ultrahigh vacuum CVD, microwave plasma assisted CVD, plasma enhanced CVD, combustion CVD, or photoinitiated CVD. Coated karstified foils are shown to not only decrease the interfacial resistance but also further increase a durability of supercapacitors with aqueous electrolytes. It is noted that advantageously the PVD process can be performed in the same vacuum chamber where the pulsed laser ablation is performed, to reduce oxidation and contamination of the sample, and expedite fabrication.

Accordingly, a method for karstifying a metal surface is provided. The method involves providing a metal surface, retained in place within a vacuum chamber; evacuating the chamber to a pressure less than $7 \times 10^{-3}$ Pa; and applying a high power laser radiation to the surface, the radiation having an irradiance sufficient to ablate the metal, leaving a karstified topography on the surface. The karstified topography has a surface morphology in which: a maximum peak height minus a maximum profile depth is greater than 2.5 µm and is at least 5% of the foil thickness; a root mean square roughness is at least about 2 µm measured in a direction of greatest roughness; and an oxygen abundance on the surface is less than atomic 5%.

Preferably the surface morphology has a height distribution that is at least approximately Gaussian, has a skewness less than +/−1.5, and a kurtosis in a range of 2-11. Profiles of the surface morphology, defined as a height of the surface along a line segment in a plane of the surface, preferably show that a mean separation of peaks and valleys is less than 50 microns. More preferably the mean separation is less than 5 microns. Furthermore, the profiles preferably show that at least 5% of the slope of the profiles are greater than 5 or less than −5, and thus include regions that are rising or falling steeply. Preferably less than least 5% of the slope distribution is greater than 10 and less than −10.

The metal surface is preferably a foil may be composed of a metal that naturally forms an oxide that has a higher electrical resistance than the metal, and the method may further involve applying a passivating layer onto the karstified topography, the passivating layer having a higher electrical conductivity than that of the oxide.

Applying the passivating layer may involve: depositing the passivating layer in the vacuum chamber; applying physical vapour deposition (PVD) processes, where PVD specifically includes deposition processes including pulsed laser deposition, cathodic arc deposition, electron beam physical vapor deposition, evaporative deposition, and sputter deposition; or applying a pulsed laser deposition process that uses a same laser as was used to produce the high power electromagnetic radiation pattern.

The foil may be composed of Al, Ni, Ti, Cu, or stainless steel or an alloy or mixture of one or more of the above, and the passivating layer may be composed of one or more metals, alloys, carbon or conductive metal oxides.

Providing the foil may involve mounting the foil to a reel-to-reel system within the vacuum chamber. The foil may be less than 0.5 mm thick, 0.01-0.2 mm thick, or 0.020-0.050 mm thick, and the maximum peak height minus the maximum profile depth of the karstified topography may be 5-50% of the foil thickness.

Applying a high power laser radiation pattern to the surface may involve: moving one or more lasers, or optical components for redirecting a beam from the one or more lasers, with respect to the surface to produce a time-varying high power electromagnetic radiation pattern; moving one or more lasers that are located outside of the vacuum chamber with respect to a window of the vacuum chamber; operating a short pulse, high energy laser with focusing optics to focus the energy to achieve high spatio-temporal focusing of the electromagnetic radiation; operating a femtosecond laser; operating a picosecond laser; operating a nanosecond laser, operating an eximer laser; or operating a Q-switched Nd-YAG solid state laser.

Also accordingly, a metal foil is provided, the metal foil being less than 0.5 mm thick, bearing a karstified topography. The karstified topography has a surface morphology in which: a maximum peak height minus a maximum profile depth is greater than 0.5 μm, more preferably greater than 1.5 μm, and preferably more than 2.5 μm and is at least 5% of the foil thickness; a root mean square roughness is at least about 0.2 μm measured in a direction of greatest roughness; and an oxygen abundance on the surface is less than atomic 5%.

Preferably the surface morphology has a height distribution that is at least approximately Gaussian, has a skewness less than +/−1.5, and a kurtosis in a range of 2-11. Profiles of the surface morphology, defined as a height of the surface along a line segment in a plane of the surface, preferably show that a mean separation of peaks and valleys is less than 50 microns. More preferably the mean separation is less than 5 microns. Furthermore, the profiles preferably show that at least 5% of the slope of the profiles are greater than 5 or less than −5, and thus include regions that are rising or falling steeply. Preferably less than least 5% of the slope distribution is greater than 10 and less than −10.

The foil may be composed of a metal or alloy that resists corrosion and has a high electrical conductivity, such as Al, stainless steel, Cu, Ag, Ni, Ti, or a mixture or alloy of two or more of the above.

The foil may be is coated with a metal, alloy, carbon or conductive metal oxide that resists oxidation and has a high electrical conductivity. For example, the foil may be composed of Al, an Al alloy, Cu, or a Cu alloy, and have a coating of a conductive metal, alloy, carbon, metal oxide, or combination thereof. The foil may be composed of Al, an Al alloy, Cu, or a Cu alloy, and has a coating of nickel or an alloy thereof, titanium or an alloy thereof, carbon or an alloy thereof; nickel oxide, titanium dioxide, zinc oxide, and indium tin oxide, or a mixture of any one or more of the above.

The foil may have a foil thickness of less than 0.5 mm, 0.01-0.2 mm, or 0.020-0.050 mm, and the maximum peak height minus maximum profile depth of the karstified topography may be 5-50% of the foil thickness.

Also accordingly, a high surface area metallic electrochemical interface is provided comprising a metal foil less than 1 mm thick, the metal foil having a first face facing an active material, the first face bearing a karstified topography. The karstified topography has a surface morphology in which: a maximum peak height minus a maximum profile depth is greater than 0.5 μm and is at least 5% of the foil thickness; a root mean square roughness is at least about 0.2 μm measured in a direction of greatest roughness; and an oxygen abundance on the surface is less than atomic 5%.

Preferably the surface morphology has a height distribution that is at least approximately Gaussian, has a skewness less than +/−1.5, and a kurtosis in a range of 2-11. Profiles of the surface morphology, defined as a height of the surface along a line segment in a plane of the surface, preferably show that a mean separation of peaks and valleys is less than 50 microns. More preferably the mean separation is less than 5 microns. Furthermore, the profiles preferably show that at least 5% of the slope of the profiles are greater than 5 or less than −5, and thus include regions that are rising or falling steeply. Preferably less than least 5% of the slope distribution is greater than 10 and less than −10.

The foil may be composed of a metal or alloy that resists corrosion and has a high electrical conductivity, such as Al, an Al alloy, stainless steel, Cu, a Cu alloy, Ag, an Ag alloy, Ti, or a Ti alloy, Ni or a Ni alloy.

The foil may be coated with a metal, alloy, carbon or conductive metal oxide that resists corrosion and has a high electrical conductivity. The foil may be composed of Al, an Al alloy, Cu, or a Cu alloy, and has a coating of a conductive metal, alloy, carbon, metal oxide, or combination thereof. The foil may be composed of Al, an Al alloy, and Cu, or a Cu alloy, and has a coating consisting of nickel or an alloy thereof, titanium or an alloy thereof, carbon or an alloy thereof; nickel oxide, titanium dioxide, zinc oxide, and indium tin oxide, or a mixture of carbon and any one or more of the above.

The foil may be less than 0.5 mm thick, 0.01-0.2 mm thick, or 0.020-0.050 mm thick, and the maximum peak height minus maximum profile depth of the karstified topography is 5-50% of the foil thickness.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which.

DESCRIPTION OF PREFERRED EMBODIMENTS

Herein a technique for karstification of metal foils is described. The technique involves vacuum laser ablation of the foil. Advantageously, the foil can be composed of a lower cost metal or alloy, such as Al, Cu, Ni, Ti, stainless steel, or alloys or mixtures of one or more thereof, that tend to form a lower electrical conductivity surface oxide coating, and the karstified foil can be coated with a passivating layer that precludes formation of such a surface coating, while still in the vacuum, whereby a metal foil with a passivated, karstified surface can be produced with reduced oxide content between the passivation coating and foil. The vacuum laser ablation produces a karstified topography on the surface with a surface morphology in which: a maximum peak height minus a maximum profile depth is greater than 0.5 μm; a root mean square roughness is at least about 0.2 μm; and an oxygen abundance is less than atomic 5%. Preferably the surface morphology has a height distribution that is at least approximately Gaussian, has a skewness less than +/−1.5, and a kurtosis in a range of 2-11. Profiles of the surface morphology, defined as a height of the surface along a line segment in a plane of the surface, preferably show that a mean separation of peaks and valleys is less than 50 microns. More preferably the mean separation is less than 5 microns. Furthermore, the profiles preferably show that at least 5% of the slope of the profiles are greater than 5 or less than −5, and thus include regions that are rising or falling steeply. Preferably less than least 5% of the slope distribution is greater than 10 and less than −10.

Figure 1:
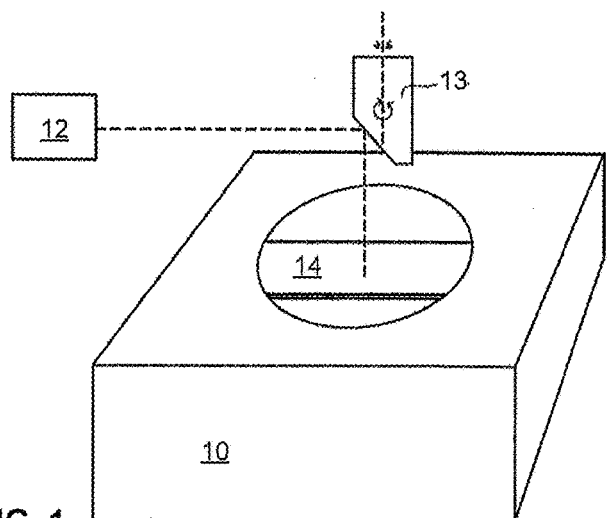
FIG. 1 is a schematic illustration of a system for karstifying a metallic foil in accordance with an embodiment of the present invention.

FIG. 1 is a schematic illustration of a system for karstifying a metal foil, in accordance with an embodiment of the present invention. The method comprises a vacuum chamber 10 containing a metal foil 14. The chamber is preferably equipped to provide a vacuum of at least $1.3 \times 10^{-2}$ Pa, and more preferably from $1.3 \times 10^{-3}$-$1.3 \times 10^{-6}$ Pa, although higher vacuum can always be used. The chamber may be equipped with a variety of thermal control devices, foil manipulators, and devices associated with such equipment known in the art.

The metal foil 14 will be understood to have a thickness less than 1 mm, such as a thickness of 10-800 microns, more preferably from 11-600 microns, 12-500 microns, or 12-150 microns, and most commonly from 15-55 microns. The metal foil may be composed of an alloy, or other compounded foil such as an intermetallic foil, and may initially have a native oxide surface layer, for example. The metal foil may be composed principally of aluminum, copper, or titanium, nickel, alloys of them and in principle can be composed of silver, gold, or of any noble metal. The metal foil may be Al or an alloy thereof, or a steel, such as stainless steel, or titanium or an alloy thereof, or nickel or an alloy thereof. Copper, steel, titanium, nickel and Al (and their alloys) are particularly valuable as current collectors in batteries, supercapacitors, and other electrochemical cells, as well as in noble metal catalyst applications, or gas phase chemical reactions. The karstification of more expensive noble metal foils, or lower cost metal foils coated with more expensive noble metal, may have advantages over noble metal particles used in some applications, where localization of the noble metal is critical.

An optical system 12 is provided for generating an laser beam that is adapted to distribute power to ablate an exposed surface of the foil 14 with a pattern that is defined spatially and temporally. While FIG. 1 shows a simple reflector 13 with a 2 degree of freedom (DoF) mounting for redirecting a beam onto the surface of the foil 14 through a window of the chamber 10, it will be appreciated that a wide variety of optical equipment can be used including a mechanical motion stage. The particular 2 DoF system illustrated is schematic, and is not particularly representative of typical systems. For example, it is typically preferable to orient a beam onto the surface through the window over a narrow range of angles that are centered at zero angle of incidence of the window, to minimize losses through the window, and it is generally preferable to scan without varying an optical path length from focusing optics of the beam to the surface. Nonetheless a very wide range of optical systems are known for directing one or more beams of one or more high power optical sources, such as lasers, through windows of vacuum chambers, onto surfaces. It is also well known in the art to include translation tables and moving devices outside or within vacuum chambers to reduce a number of degrees of motion required by the beam. Finally it will be noted that diffraction, refraction, and interference effects are also leveraged to provide highly focused spatio-temporal electromagnetic radiation patterns.

Figure 2:
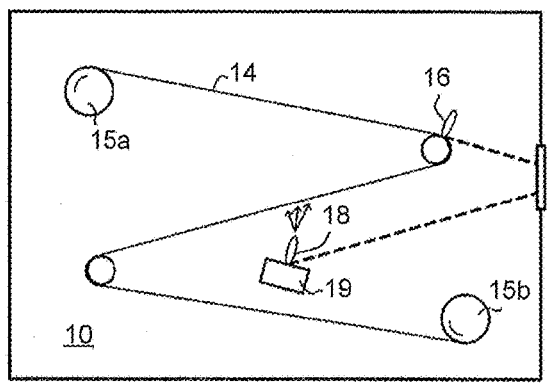
FIG. 2 is a schematic illustration of a system for karstifying a metallic foil, and applying a passivating layer in accordance with an embodiment of the present invention.

FIG. 2 is a schematic illustration of an exemplary structure within a chamber 10 that provides a relatively simple arrangement for vacuum laser ablation of the foils (resulting in karstification), and coating, in accordance with an embodiment of the present invention. The chamber 10 is shown equipped with a reel-to-reel apparatus consisting of foil rolls 15a,b, and two intermediate rollers, the foil 14 extending between the two foil rolls 15a,b and around the two intermediate rollers. A first of the intermediate rollers is shown providing a support for the karstification. A plasma plume 16 is ejected from the foil 14 upon incidence of a laser beam that scans across a width of the foil. The foil 14 moves past the first intermediate roller bearing a karstified surface. The plasma plume 16 directs the ejected material away from the karstified surface of the foil.

It will be appreciated that tensioning and tension-reducing roller arrangements, and various supports, may be used to support the foil during the ablation/karstification, especially if the foil is more fragile. Furthermore thermal control equipment may be used to limit a warping or distortion of the foil due to a heating of the foil during the ablation.

The karstified surface of the foil 14 is then subjected to a deposition process, where a passivating layer is applied thereto. This is shown performed by a laser ablation process initiated by a laser beam striking a target 19 to eject a plume 18 of a material that gets deposited onto the karstified surface of the foil 14. It is well known in the art how to deposit plasma, gas, and particulate matter in a vacuum chamber according to such processes as chemical vapor deposition (CVD), physical vapor deposition (PVD). Herein CVD refers to a set of deposition processes specifically including Atmospheric pressure CVD (APCVD), Low-pressure CVD (LPCVD), Ultrahigh vacuum CVD (UHVCVD), Microwave plasma-assisted CVD (MPCVD), Plasma-Enhanced CVD (PECVD), Combustion Chemical Vapor Deposition (CCVD), and Photo-initiated CVD (PICVD). PVD includes cathodic arc deposition, electron beam PVD, evaporative deposition, sputtering deposition, and pulsed laser deposition.

An advantage of the illustrated arrangement using a roller to separate ablation processes (plume 16) from deposition processes (plume 18), include a continuous, or substantially continuous process for karstifying and passivating foil surfaces. The continuous process may be provided in parallel, intermittently, or serially in that: one area of the foil may be karstified while a previously karstified area is coated; one area may be karstified, and then a previously karstified area is coated, followed by karstification of a next area; or the whole foil may be unwound for karstification followed by a rewinding for coating. Thus it is possible to use a same laser such as high power pulsed laser, for both karstification and deposition, where appropriate.

Figure 3:
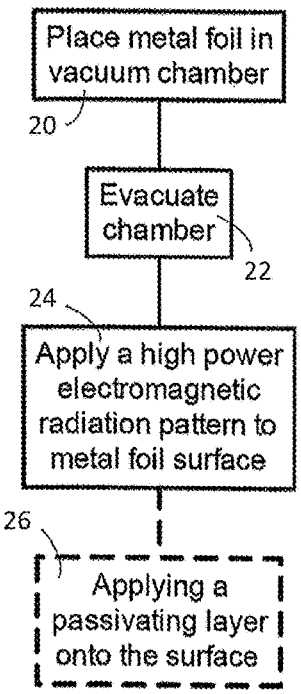
FIG. 3 is a flow chart illustrating principal steps in a method for karstifying a surface in accordance with an embodiment of the present invention.

A method of the present invention is presented as a flow chart in FIG. 3. The method comprises placing a foil into a vacuum chamber 20, evacuating the chamber 22, applying a pattern of electromagnetic radiation to karstify the surface 24, and, optionally, applying a passivation layer to the surface 26.

Placing the foil into the vacuum chamber 20 may require supporting the foil in place, which can be accomplished using a variety of roll-to-roll forming equipment well known in the art. It is known in the art how to produce and operate roll-to-roll forming equipment in vacuum chambers, such as those offered by Mustang Vaccum of Sarasota, Fla., or Picosun of Detroit, Mi.

Evacuating the chamber may involve applying a vacuum pump (step 22), as is well known in the art. Methods for inserting rolls of foils into and removing them from, a vacuum chamber with minimal entrainment of air, are known in the art, and would typically be used to minimize the work, energy and time required to achieve the desired vacuum. The desired vacuum will depend on a variety of properties of the materials and the ablation process, but will generally be at least $1.3 \times 10^{-2}$ Pa, and more preferably from $1.3 \times 10^{-3}$-$1.3 \times 10^{-6}$, for most foils and processes. The principal advantage of achieving such a vacuum is the karstification of the surface under laser ablation without causing, or with minimal, surface oxidation.

Applying the pattern of laser radiation (step 24) may comprise operating one or more light sources. Preferably a short-pulse laser, such as nanosecond, sub-nanosecond, picosecond or femtosecond laser is used so that the energy supplied to a point on the surface of the foil at an instant can be very high, while limiting an amount of heat applied to the foil, as heat tends to warp foils under tension. Short-pulsed Q-Switched Diode-Pumped Solid-State Lasers are known lasers adapted to build up laser power between pulses and delivering high power pulses. Excimer lasers are also able to develop high energy density and can be used to deliver this energy over a very localized space and time.

The optional step 26 of depositing a passivating layer may be performed by depositing a coating onto the karstified foil without removal of the foil from the vacuum chamber, using known multi-compartment vacuum chambers. Advantageously a same optical power source can be used for ablating a target if the passivating layer is applied by pulse laser deposition, or a like technique. Deposition of plasma, gas, and particulate matter in a vacuum chamber according to such processes as CVD, and PVD, including sputtering, magnetron sputtering, pulsed laser deposition, thermal evaporation, Cathodic arc deposition and electron beam evaporation are well known in the art, and may be suitable for particular applications.

Example 1

Karstification with Solid State Q-Switched Laser

Applicant has demonstrated surface karstification by vacuum laser ablation of metallic foils. The experimental set-up for karstification included a high-vacuum stainless steel chamber with a glass cover to allow a laser beam to pass through it; a Spectra-Physics™ diode pumped solid state Q-switched laser (Model J40-BL6-106Q) operating at 1064 nm wavelength, with a power >5.0 W, energy per pulse >140 µJ, repetition rate of 1-150 kHz; an Aerotech™ X-Y-Z 3-axis motion stage to which the laser was mounted, conventional laser beam focusing optics (focusing the beam to 30 µm diameter), and sample foils (commercial grade 316 stainless steel (75 and 50 micron), aluminum foils 500, 50, 25 micron thick, and copper 25 and 50 microns) were chosen and mechanically mounted on a smooth ceramic support disc within the vacuum). The vacuum chamber was pumped down to very high vacuum level ($5 \times 10^{-7}$ Torr, although $0.5$-$1 \times 10^{-5}$ Torr has been found to be sufficient for Al; $1$-$5 \times 10^{-5}$ Torr for Cu; and $5 \times 10^{-5}$ Torr for stainless steel) using a turbo pump and a mechanical pump. The laser beam was focused onto the surface of stainless steel, aluminum, or copper foils by means of a focal length lens and z axis motion stage. The laser beam was scanned on the foil surface in x and y directions during the karstification process. The x, y and z axes motion of the laser beam was controlled by the Aerotech X-Y-Z 3-axis motion stage with its associated software. The x-y-z motion stage was controlled to scan the large surface of metal foils to karstify the surface over (9 cm², 25 cm² or 100 cm²). The scan rate was about 200 mm/min, the pulse rate was 500-10 kHz, the pulse width was ~6 ns.

Table 1 below lists the laser parameters that were varied to produce the respective karstifications micrographed in FIGS. 4A-4L.

TABLE 1

| SEM FIG. Number | Diode laser drive current (A) | Repetition rate (Hz) | Power (w) | Pulse Energy (µJ) | Energy density per pulse (J/cm²) |
|---|---|---|---|---|---|
| 4A | 20 | 500 | 0.052 | 104 | 0.035 |
| 4B | 20 | 1000 | 0.101 | 101 | 0.034 |
| 4C | 20 | 5000 | 0.490 | 98 | 0.033 |
| 4D | 20 | 10000 | 1.24 | 124 | 0.041 |
| 4E | 25 | 500 | 0.081 | 162 | 0.054 |
| 4F | 25 | 1000 | 0.154 | 154 | 0.051 |
| 4G | 25 | 5000 | 0.722 | 144 | 0.048 |
| 4H | 25 | 10000 | 1.35 | 135 | 0.045 |
| 4I | 30 | 100 | 0.066 | 660 | 0.22 |
| 4J | 30 | 500 | 0.133 | 266 | 0.089 |
| 4K | 30 | 1000 | 0.210 | 219 | 0.073 |
| 4L | 30 | 5000 | 0.875 | 175 | 0.058 |

FIGS. 4A-4L show the wide variety of karstifications possible by varying the ablation parameters of the diode pumped solid state Q-switched laser. Warping and tearing of the foils was not a problem, as the ablation was set to a depth of 2-20 µm for a foil that was 50 µm deep. The limit of the depth of karstification for a given foil has not been established. A careful selection of the karstification regime to match the particle size and shape of any electrode active material of the energy storage cells such as supercapacitors and Li-ion battery may be made to increase intimacy of the electrode and the foil.

Figure 4A:
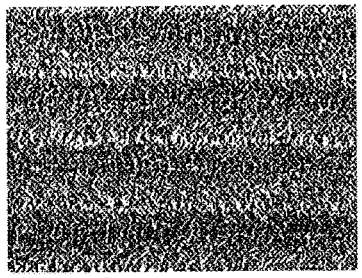
FIGS. 4A-4L are micrographs at 500× magnification of 12 50 micron thick Al foils showing how karstification can be adjusted by varying laser ablation parameters.
Figure 4B:
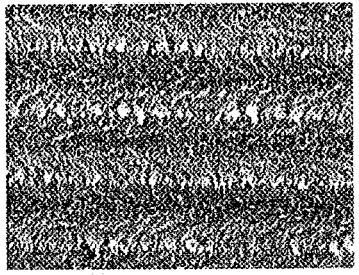
Figure 4C:
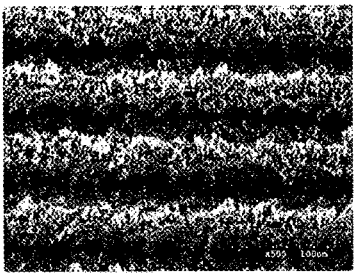
Figure 4D:
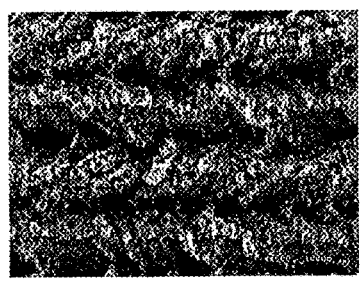
Figure 4E:
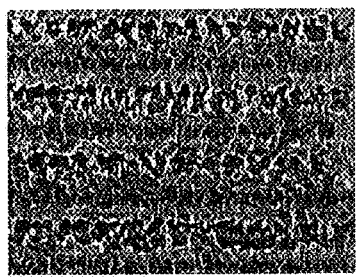
Figure 4F:
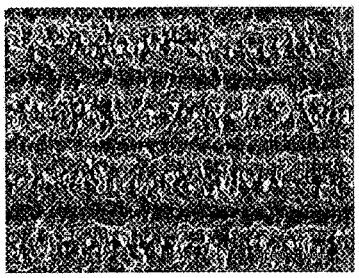
Figure 4G:
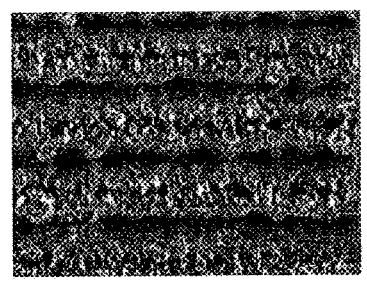
Figure 4H:
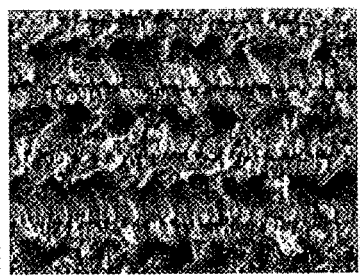
Figure 4I:
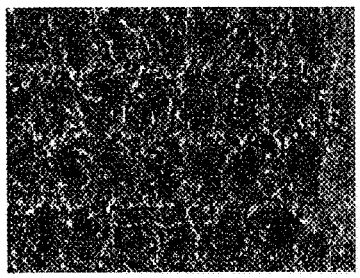
Figure 4J:
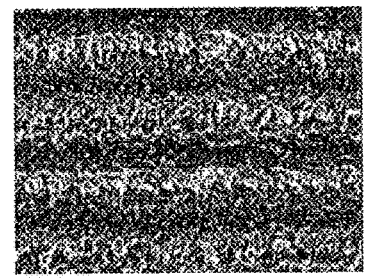
Figure 4K:
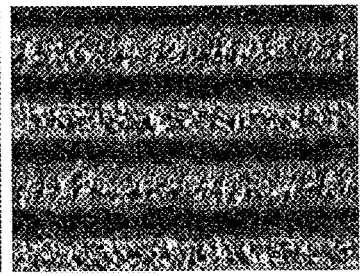
Figure 4L:
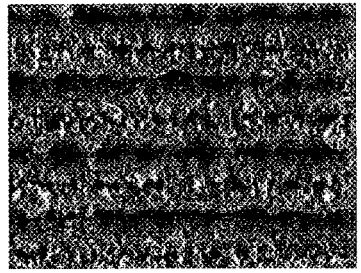
Figure 5A:
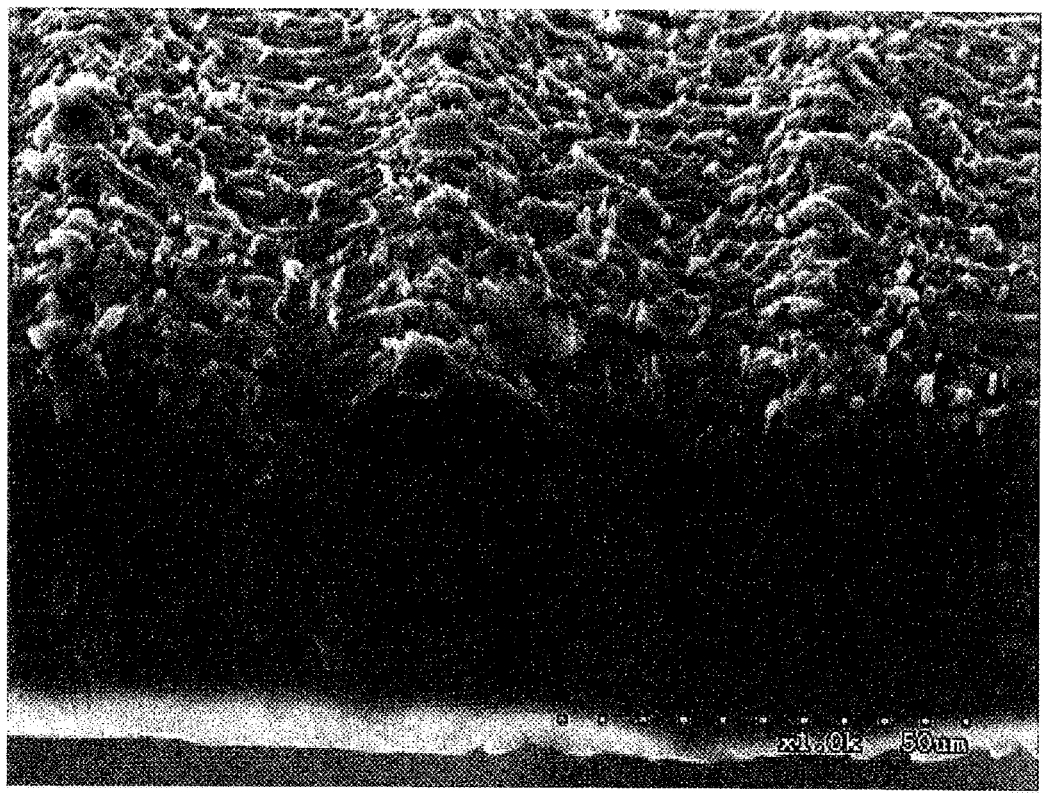
FIG. 5A, is a magnified surface, and cross-sectional, micrograph of FIG. 4J.

FIG. 5A is a magnified surface and cross sectional micrograph of a karstified Al foil showing a particular surface produced using the process parameters shown in FIG. 4J. It will be appreciated by those of skill in the art that this surface morphology is different in term of surface morphology, feature and roughness than those possible with conventional etching (wet or dry), including plasma or ion gun etching.

Figure 5B:
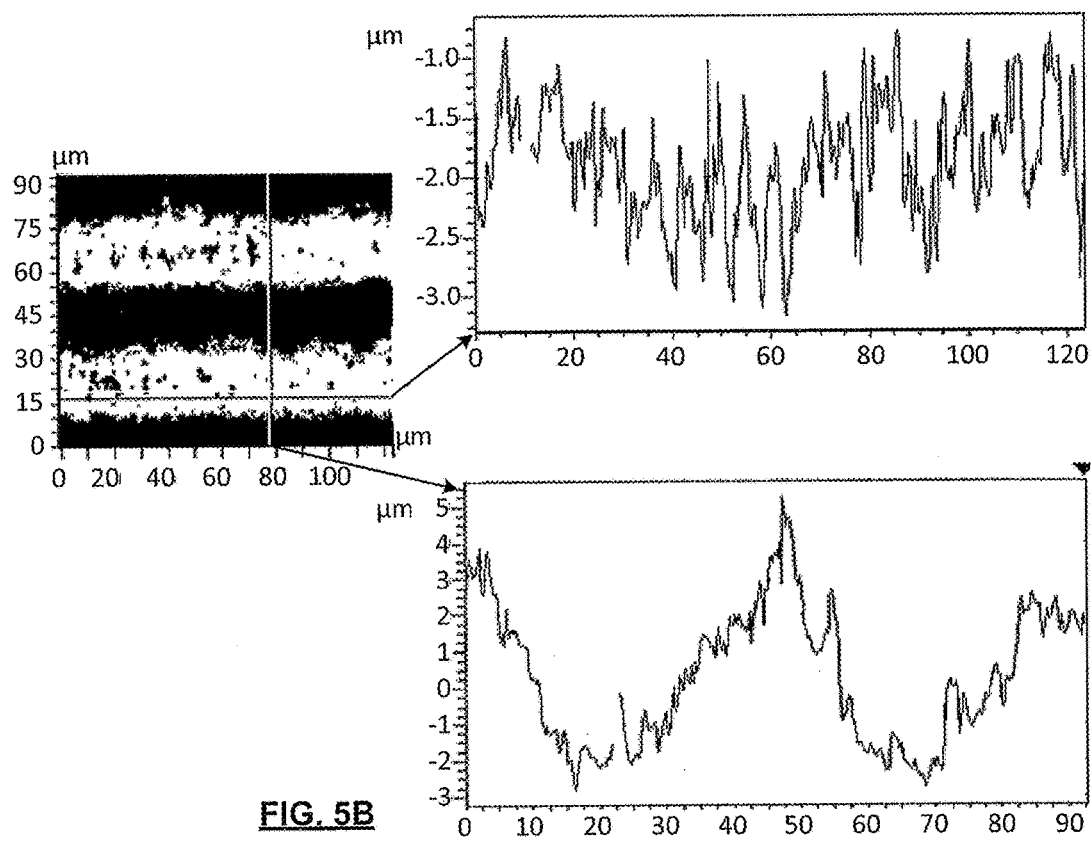
FIGS. 5B,5C are panels, each containing two graphs of respective profile maps and a legend showing a horizontal (top) and vertical (bottom) line where the profile was taken.
Figure 5C:
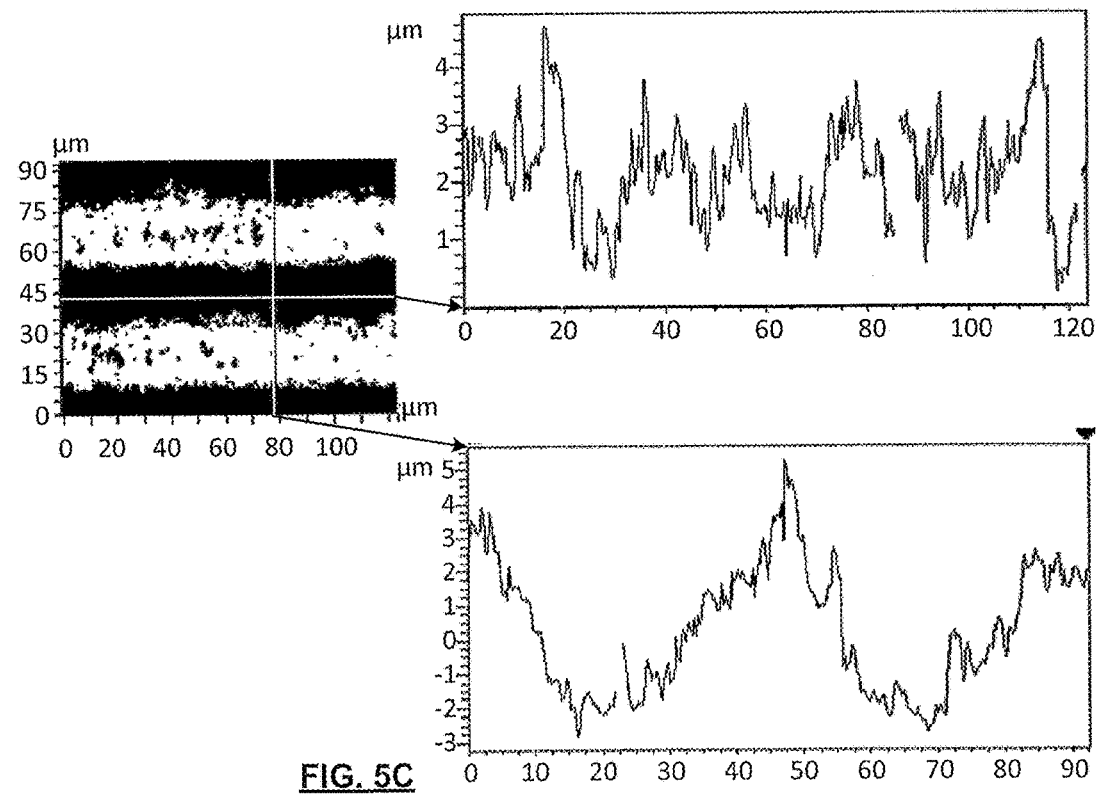

The surface was analyzed by Wyko Optical profilometry along two lines: a horizontal line lying in a valley and a vertical line that crossed valleys and ridges. Along the valley (horizontal line y=16.60 µm of the legend) there is considerable depth variation, and a very high surface length. A mean separation of local peaks and valleys is clearly less than 5 µm and an absolute value of the slope at at least 20% of points is very high (more than 5). The vertical line (x=78.16 µm of the legend) exhibited higher variations, and a smoother overall large-scale pattern. A mean separation of local peaks and valleys is clearly less than 2 µm and an absolute value of the slope at at least 10% of points is very high (more than 5). FIG. 5C shows a profile of the same vertical line and a second horizontal line, that is located at an edge of the ridge. The vertical line in FIG. 5C is the same as that in FIG. 5B, and accordingly those two graphs are identical. The horizontal line y=45.54 µm of the legend) there is considerable depth variation, and a very high surface length.

Table 2 below lists the surface roughness parameters that were measured on the karstifications micrographed of the surface produced using the parameters of FIG. 4J.

TABLE 2

| Karstified Al surface profile | Root mean square roughness $R_q$ | Roughness average $R_a$ | Maximum height of the surface $R_t$ | Maximum profile peak height $R_p$ | Maximum profile depth $R_v$ |
|---|---|---|---|---|---|
| Along the valley | 0.49 µm | 0.40 µm | 2.41 µm | −0.77 µm | −3.18 µm |
| Across ridges-valleys | 1.85 µm | 1.62 µm | 8.10 µm | 5.26 µm | −2.84 µm |
| Along the ridge | 0.88 µm | 0.70 µm | 4.67 µm | 4.70 µm | 0.03 µm |

The depth of laser roughening of the 50 µm Al foil at FIG. 4J is given by the maximum peak height minus maximum profile depth across the peak-valley, which is around 8.1 µm when measured along the vertical line. The laser roughened depth can be adjusted by laser power and the feed rate of x-y-z motion stage. The roughened depth will generally be at least 2.5-25 µm, and more preferably from 5-15 µm, for 50 µm thick foils. The root mean square and average roughness are in the range of 0.4-0.6 µm along the valley and in the range of 0.7-0.9 µm along the ridge. The root mean square and average roughness are in the range of 1.6-1.9 µm across the profile ridge-valley. The surface roughness parameters of karstified Al surface can be changed by laser ablation parameters described in table 1. The peaks density along the ridge is estimated to be 120-1200 peaks per mm.

Oxidation

A karstified Al foil was examined by energy dispersive x-ray spectroscopy (EDX) to assess the oxidation of a karstified foil. Results of the examination are shown in table 3. The oxygen atomic percentage was found to be less than 3.21 atomic % as detected on the machined area by the EDX method, indicating that the laser surface karstification process only slightly oxidized the aluminum surface. Table 3 below lists the weight % and atomic % of the machined area of karstified Al foil shown in the micrograph of FIG. 4J.

TABLE 3

| Element | Weight % | Atomic % |
|---|---|---|
| OK | 1.93 | 3.21 |
| AlK | 98.07 | 96.79 |

Supercapacitor and Li-Ion Battery Cells Resistance Testing

The vacuum laser karstified Al foils were used as current collectors, and were tested in supercapacitor cells, in order to assess any change in performance in the internal resistance of the cells produced by substituting the karstified surface with a smooth electrode. A typical supercapacitor is composed of a separator film covered on both sides by an electrode active material, and two metallic current collectors on opposite sides of the separator film, such that the active material and separator film are sandwiched between the two metallic current collectors.

Figure 6A:
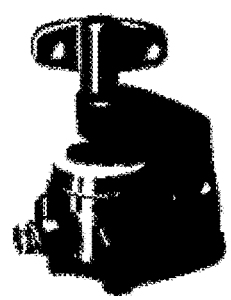
FIG. 6A is a schematic illustration of an EL-CELL™ supercapacitor button cell in an exploded view.
Figure 6B:
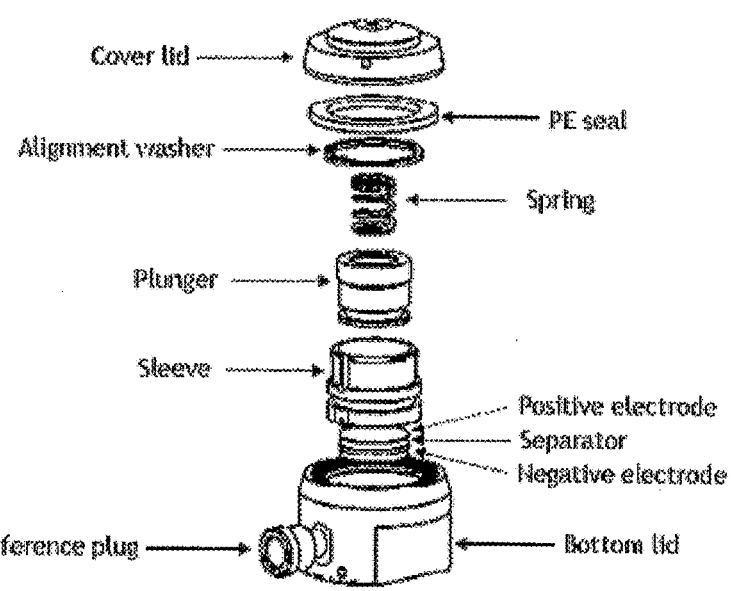
FIG. 6B is a schematic illustration of an EL-CELL™ supercapacitor button cell assembled with a current collector provided by the Al foil of FIG. 4J.

Kuraray™ RP20 was used as the electrode active material (electrode formulation: 85 wt % RP20, 10 wt % Ketjenblack EC600JD™ (from FIPZ Chem) and 5 wt % polytetrafluoroethylene (PTFE) as a binder). The thickness of the pastes was 100±2 µm after pressing. It was punched at 16 mm diameter, and dried at 120° C. under active vacuum for at least 48 h. Fabrication of the test cells involved a hydraulic press used to press the active material into the Al foil with a load of 10,000 lbs for 30 s at 100° C. The 50 µm thick Al foils were karstified (or not) as described above with the process parameters associated with FIG. 4J. The active material and current collector assembly were dried for another 12 h at 120° C. under active vacuum before transfer into the glovebox for assembly. The active material that coated karstified Al current collectors were used as both positive and negative electrodes and assembled with a Gore separator film immersed in 1 M NEt4BF4 in acetonitrile (ACN) electrolyte for testing. Unkarstified foils were used to assemble a control cell for comparison, and were otherwise identical. An ECC-Aqu electrochemical cell fabricated by EL-CELL GmbH was used for the evaluation of the RP20 based symmetric supercapacitor cells having those karstified and unkarstified Al foil current collectors. A schematic drawing of the EL-CELL electrochemical cell is shown in FIGS. 6A and 6B. As this is a conventional design, no further description of the electrochemical cell is provided here.

Figure 7A:
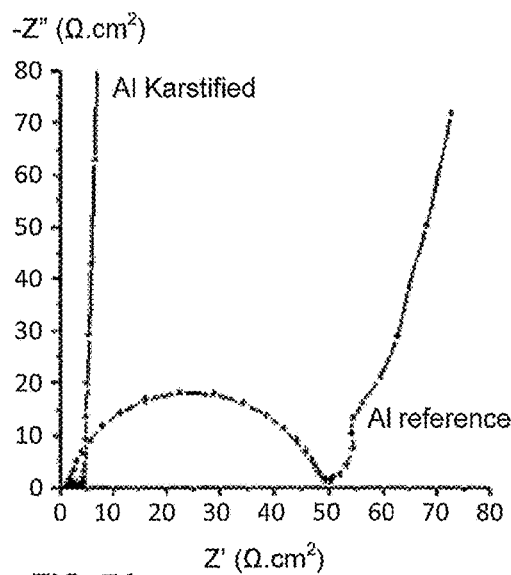
FIG. 7A is a Nyquist impedance plot comparing a reference Al foil and a karstified Al foil as current collectors in an activated carbon based symmetric supercapacitor using EL-CELL shown in FIG. 6B, with an organic electrolyte.

Impedance spectroscopy (using 10 mV amplitude and 10 mHz-0.2 MHz frequency) was first used to analyze the internal resistance of the button cells. FIG. 7A is an impedance spectroscopy Nyquist plot for the cells assembled with the karstified (with FIG. 4J surface morphology) and unkarstified (namely a reference with Al foils that were unkarstified) Al foil current collectors. The Nyquist plots show high frequency semi-circles that are characteristic of a charge transfer barrier at the interface between the current collector and the RP20 active materials layer. This semi-circle is absent from the Nyquist plots when platinum or gold current collectors are used (not shown) because platinum and gold are a noble metals with no surface oxide layer. The semi-circle is due to the transfer of electrons through the oxide surface layer.

The karstification of the current collectors had a strong influence on the size of the semi-circle (which is caused by the ohmic barrier of the alumina ($Al_2O_3$) insulating layer present at the aluminum surface and it is directly proportional to the interfacial charge transfer resistance). The karstified Al current collectors display much smaller semi-circle indicating lower interfacial resistance than the unkarstified Al reference collector. The intercepts of semi-circle with Z' axis were 3.7Ω and 50Ω, respectively for supercapacitor cells with karstified and unkarstified Al current collectors. FIG. 7A demonstrates that the resistance-decreasing effect of karstifying the Al current collector due to a substantial increase of the interface area between the collector and the RP20 active layer.

Cyclic Voltammetry

Figure 7B:
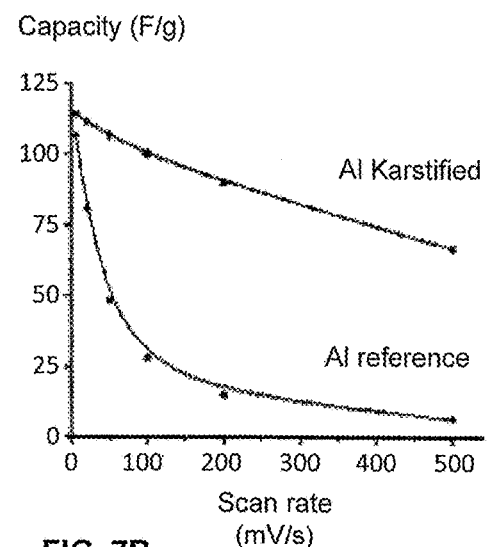
FIG. 7B is a graph showing capacitance vs. scan rate of the same EL-CELLs in FIG. 7A.

In order to further characterize the performances of karstified Al foils as current collectors, charge-discharge cycles were carried out using cyclic voltammetry at different scan rates. The cyclic voltammograms (not shown) of the button cell with the karstified Al current collectors displayed more quasi-perfect rectangular shapes at low scan rates than that of the button cell with unkarstified Al current collectors, as is expected from double-layer capacitors. The specific capacitances obtained from cyclic voltammograms at different scan rates was shown in FIG. 7B. The specific capacitances of supercapacitor cell with karstified have higher values than that of and supercapacitor cell with unkarstified Al current collectors, particularly at high potential scan rate, i.e. 62.8 F/g vs. 6.3 F/g at 500 mV/sec. At high scan rates, unkarstified aluminum surface does not provide a satisfactory interface with the activated carbon layer for fast electrical charge transfer. The karstified aluminum surface significantly enhances the electric contact between the RP20 active layer and the current collector, showing high specific capacitance at high scan rates.

Li-Ion Battery Cell Tests

The 50 μm thick laser karstified Al foils (with FIG. 4J surface morphology) were also used as current collectors and tested in Li-ion battery cathode ($LiFePO_4$) to assess the performance improvement in the internal resistance under Li-ion battery environment. A typical Li-ion battery cathode used in these tests is composed of $LiFePO_4$ paste coated karstified or unkarstified Al foil cathode of 16 mm diameter, a Celgard 3501 separator and a metallic lithium foil of 100 μm thick and 16 mm diameter. The $LiFePO_4$ paste consists of Targray 85% $LiFePO_4$ commercial powder, 4% Lonza EKS-4 Graphite, 4% Super P Carbon and 7% HSV-900 polyvinylidene fluoride (PVDF) binder. An orbital mixer was used to combine all the materials to form a slurry. The slurry was coated on Al foils and dried at 85° C. in a conventional oven, followed by vacuum drying at 100° C. The slurry coated Al foil was compressed by a calendering machine to form the cathode. The $LiFePO_4$ cathode, Celgard 3501 separator and lithium foil was assembled into an EL-CELL GmbH button cell in the glovebox under argon atmosphere. A 1 M lithium bis-trifluoromethanesulfonimide (LiTFSI) in Ethylene Carbonate: Diethyl Carbonate (EC: DMC) was used as the electrolyte.

Impedance spectroscopy was used again to analyze the internal resistance of the Li-ion battery cathode cell. It was found that karstification of the Al current collectors decreases significantly the cell resistance. After 10 charging/discharging cycles at one tenth of cell Capacity ("C/10" cycles), the resistance taken from the semi-circle of impedance spectroscopy Nyquist plots (not shown here) for the $LiFePO_4$ cathode cell with unkarstified Al foils is 90Ω, while for the cell with karstified Al foils the resistance is 13Ω. After 20 days of charging/discharging cycles, the resistance of the unkarstified cell had increased to 150Ω, whereas the karstified cell had only increased to 20Ω. The karstification of the Al current collectors significantly enhances the electronic contact between the $LiFePO_4$ active layer and the Al collector and allows an enhanced power output of the cell.

Example 2

Karstification with Excimer Laser

Figure 8:
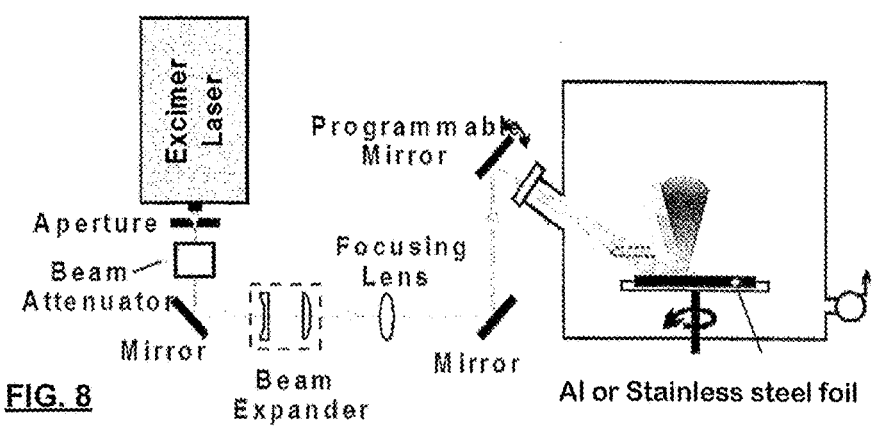
FIG. 8 is a schematic illustration of an excimer laser system for karstifying a metallic foil.

Applicant has also demonstrated surface karstification of metallic foils using vacuum laser ablation with an excimer laser operating using the experimental setup shown in FIG. 8. The excimer laser karstification system consisted of a KrF excimer laser (λ=248 nm, Lambda Physik, LPX-210i), beam steering and shaping optics, and a high-vacuum stainless steel chamber, equipped with a rotating plate for supporting the foils. The pulsed laser beam was focused onto the surface of an AISI 136L stainless steel, or aluminum, foil by means of a 100 cm focal length lens and three guiding mirrors. The laser beam was scanned over the radius of the rotating metallic foils using a preselected program and the plate was rotated at 35 rev/min. Scanning was performed using a programmable kinematic mount for the last mirror of the optical train. The laser beam spot size at the target surface was approximately 4 $mm^2$. The on-target laser beam fluence was adjusted to approximately 3-5 $J/cm^2$, with a repetition rate of 50 Hz. The duration of the exposure was 3 hours, to karstify the surface of aluminum or stainless steel of 3.5 inch in diameter. The interaction of the laser with the AISI 136L stainless steel or aluminum foils produced a plume normal to the foil surface. Before introducing a stainless steel or aluminum foil into the vacuum chamber, it was ultrasonically cleaned using acetone and isopropyl alcohol. After loading the foils, the system was pumped down to a base pressure below $4\times10^{-7}$ Torr using a turbo-molecular pump. After a given processing time, the laser was stopped, and the plate was allowed to cool down under vacuum before it was taken out for characterization.

Scanning electron micrographs of the karstified surfaces of the AISI 136L stainless steel and aluminum foils (250 µm thick) produced by karstification with a KrF excimer laser using parameters described above are shown in FIGS. 9A,9C. The root mean square roughness $R_q$, roughness average $R_a$, maximum height of the surface $R_t$, maximum profile peak height $R_p$ and maximum profile depth $R_v$ of the karstified surface of FIG. 9A for Al foils along horizontal and vertical lines (which have no correspondence with the raster scan directions, given the rotation of the plate) are shown in graphs of the panel named FIG. 9B, and for the stainless steel are shown in the panel of FIG. 9D. Analyses of the horizontal (top) and vertical (bottom) graphed profiles by Wyko Optical profilometry are presented in table 4.

Table 4 below lists the surface roughness parameters that were measured on the karstifications micrographed in FIG. 9A and FIG. 9C.

TABLE 4

| karstified surface | Root mean square roughness $R_q$ | Roughness average $R_a$ | Maximum height of the surface $R_t$ | Maximum profile peak height $R_p$ | Maximum profile depth $R_v$ |
|---|---|---|---|---|---|
| Al (X profile) | 6.01 µm | 4.91 µm | 30.16 µm | 14.58 µm | −15.58 µm |
| Al (Y profile) | 6.52 µm | 5.33 µm | 34.31 µm | 19.38 µm | −14.93 µm |
| Stainless steel (X profile) | 2.30 µm | 1.73 µm | 15.94 µm | 5.48 µm | −10.46 µm |
| Stainless steel (Y profile) | 2.25 µm | 1.64 µm | 16.30 µm | 9.08 µm | −7.22 µm |

Figure 9A:
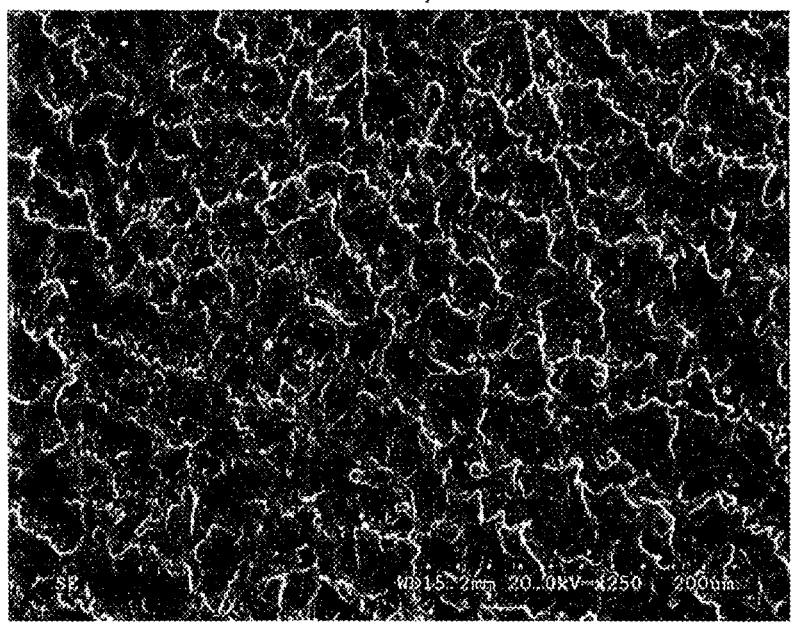
FIG. 9A, is a micrograph of an Al foil karstified by the apparatus of FIG. 8.
Figure 9B:
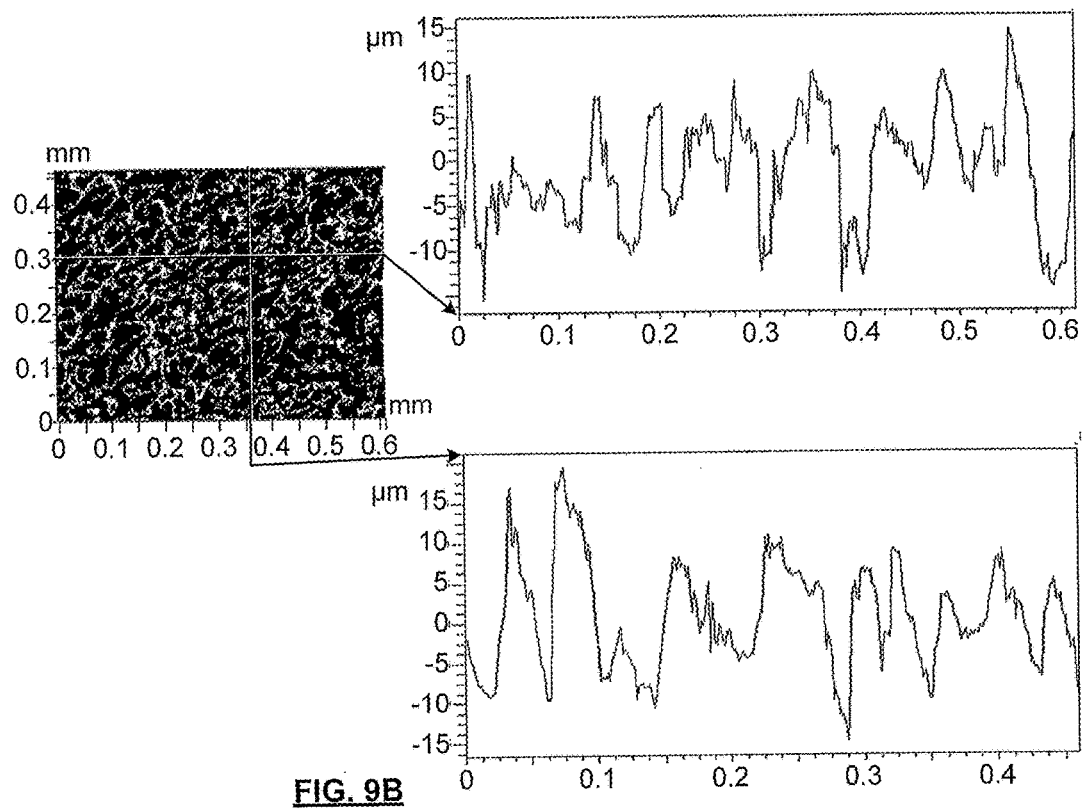
FIG. 9B is a panel containing two graphs of respective profiles and a legend showing a horizontal (top) and vertical (bottom) line where the profile was taken.
Figure 9C:
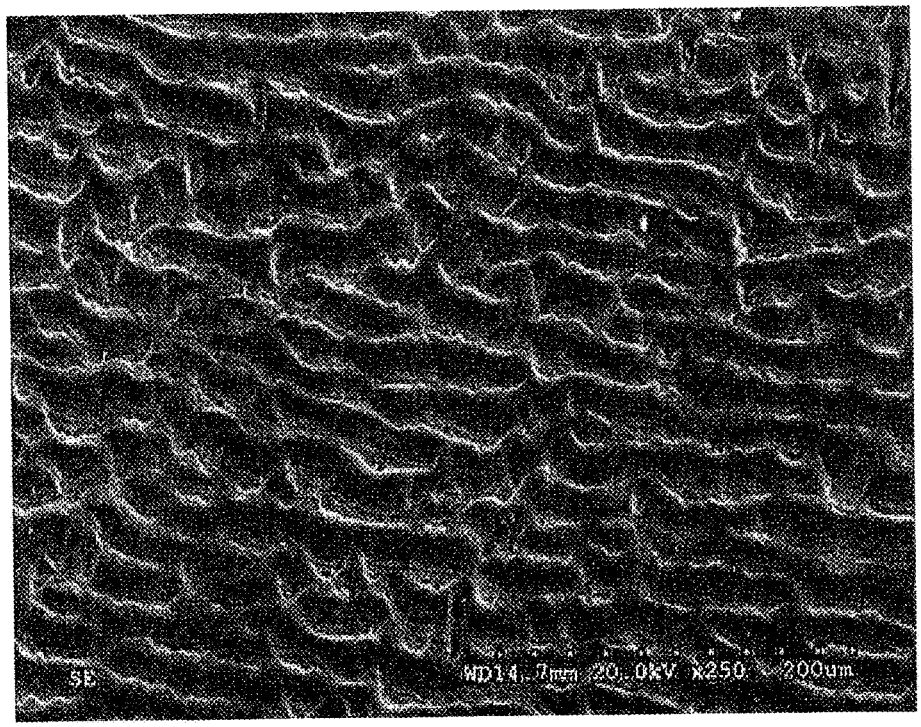
FIG. 9C, is a micrograph of a stainless steel foil karstified by the apparatus of FIG. 8.
Figure 9D:
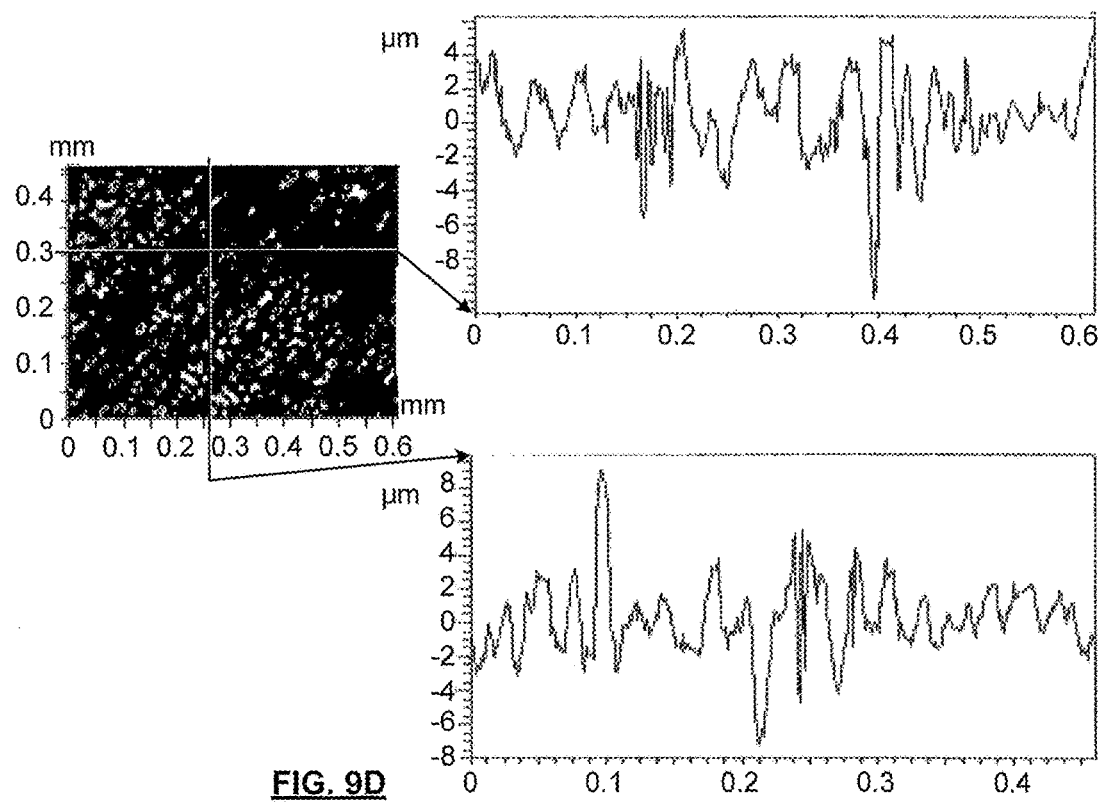
FIG. 9D is a panel containing two graphs of respective profiles and a legend showing a horizontal (top) and vertical (bottom) line where the profile was taken.

The depth of laser roughening of the 250 µm Al at FIG. 9A is giving by the maximum peak height minus maximum profile depth across the peak-valley, which is around 30-34 µm. For 250 µm stainless steel at FIG. 9C the value is around 16 µm. The laser roughened depth can be adjusted by laser power, ablation time and rotating speed of the support. The root mean square and average roughness are in the range of 5-6.5 µm for Al and 1.5-2.5 µm for stainless steel.

Similar to the diode pumped solid state Q-switched laser, the excimer laser was able to create micro-/submicro-structured surfaces on both stainless steel and aluminum foils without damaging the foils. Excimer laser ablation of aluminum foils created deeper karstification than on the AISI 136L stainless steel at the same laser processing parameters such as power density, energy density, repetition rate and processing time, as evident in comparing FIGS. 9A,9B with FIGS. 9C,9D. To create deeper surfaces on stainless steel foils with excimer laser vacuum ablation, higher energy density or longer processing time is needed. The karstified surface morphology of Al foils shown in FIG. 9A appears to be more uniform and does not show large wave morphology like in the case of solid state Q-switched laser ablation. The beam size of a focused excimer laser during ablation of Al foils is in the range of a few mm² while the solid state Q-switched laser is in the range of a few µm², therefore it is not surprising that the morphologies created by the two lasers are quite different. In addition, during karstification of metal foils by the diode pumped solid state Q-switched laser, the laser beam was scanned linearly in x- and y-directions, while karstification of metal foils by excimer laser, the laser beam was scanned over the radius of the rotating foils. Different configurations used for laser karstification of metal foils in the two examples induced very different surface morphologies as shown in FIGS. 4A-4L and FIGS. 9A-9D.

Oxidation

The karstified Al and AISI 136L stainless steel foils prepared by the excimer laser were also examined by energy dispersive x-ray spectroscopy (EDX) to assess the oxidation of the karstified foils. The oxygen atomic percentage was found to be less than 1.6 atomic % for Al foils and less than 2.7 atomic % for AISI 136L stainless steel foils as detected on the machined area by the EDX method, indicating that the laser karstification process only slightly oxidized the aluminum and stainless steel surfaces.

The excimer laser karstified Al and AISI 136L stainless steel foils were used as current collectors, and were tested in supercapacitor cells, in order to assess the performance improvement in the internal resistance of the cells produced by the karstification. Kuraray™ RP20 was used as the active material (electrode formulation: 85 wt % RP20, 10 wt % Ketjenblack™ (from FIPZ Chem) and 5 wt % PTFE applied to the current collector). The thickness of the pastes was 100±2 µm after pressing. The active material was assembled using a Gore separator, a 0.5 M $Na_2SO_4$ aqueous electrolyte, and different current collectors (either aluminum or AISI 136L stainless steel, either karstified or unkarstified, for both anode and cathode) in a typical supercapacitor cell in which the two electrodes and the in-between separator film is sandwiched by two metallic back plates with a load of 9-10 pounds. Unkarstified Al and stainless steel foils were used to assemble a control cell for comparison.

Figure 10A:
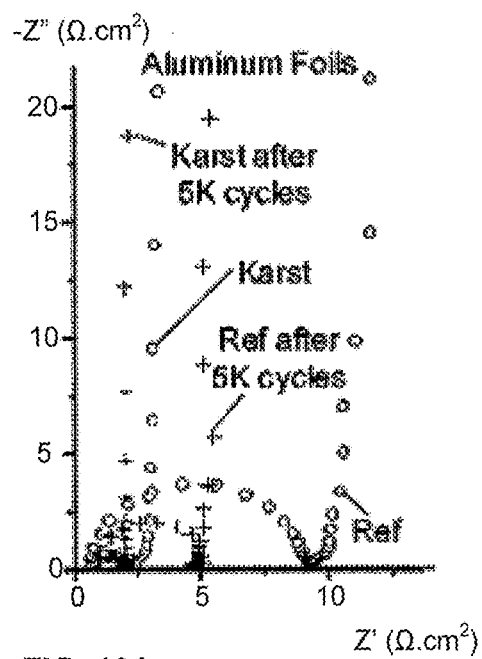
FIGS. 10A,10B are multigraphs showing Nyquist diagrams for activated carbon based symmetric supercapacitors before and after cyclic testing using a reference foil, and a karstified foil of Al (shown in FIG. 9A), and stainless steel (shown in FIG. 9C)
Figure 10B:
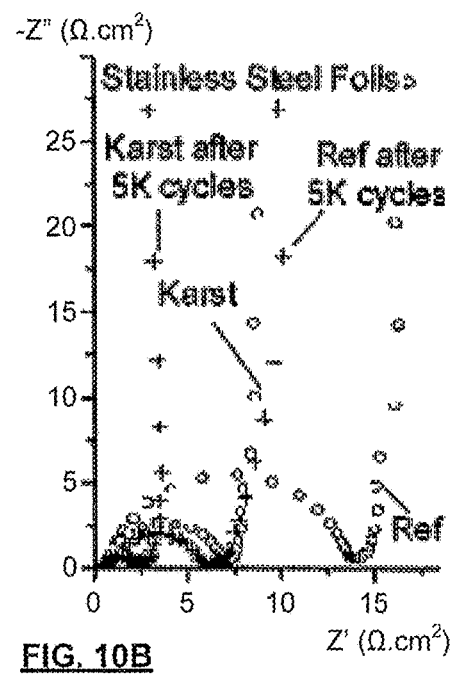

FIGS. 10A,10B show the impedance spectroscopy (using 10 mV amplitude and 10 mHz-0.2 MHz frequency) Nyquist plots of electrochemical cells assembled with the karstified and unkarstified Al and stainless steel current collectors, as well as comparisons of both karstified and unkarstified electrochemical cells before and after the first 5000 charging/discharging cycles. Again all Nyquist plots show high frequency semi-circles that are characteristic of a charge transfer barrier at the interface between the current collector and the RP20 active materials layer. The karstified current collectors have smaller diameters of the semi-circle which indicates lower interfacial resistance both for karstified stainless steel (SS) and aluminum collectors. This is due to a substantial increase of the interfacial area between the collector and the RP20 active layer for karstified current collectors. After 5000 galvanostatic charge/discharge cycles, the impedance spectroscopy Nyquist plots of supercapacitor cells were taken again and the interfacial resistance were determined again from the Nyquist plots. It was found that this resistance decreased for both reference and karstified collectors. Table 5 below lists cell resistance before and after 5000 cycles. The karstified Al and stainless steel current collectors clearly outperformed the unkarstified reference (flat) current collectors, due to improved contact between the collectors and the RP20 active layer pastes.

TABLE 5

|  | Unkarstified ref. stainless steel collectors | Unkarstified ref. Al collectors | Karstified stainless steel collectors | Karstified Al collectors |
|---|---|---|---|---|
| Cell resistance of fresh cell | 16.2 Ω·cm² | 10.0 Ω·cm² | 6.3 Ω·cm² | 2.2 Ω·cm² |
| Cell resistance after 5000 charging/discharging cycles | 6.0 Ω·cm² | 4.5 Ω·cm² | 2.4 Ω·cm² | 1.2 Ω·cm² |

Passivation

Al is the most common material for current collectors used in energy storage devices such as batteries and supercapacitors, but it's liability to surface oxidation and consequent formation of an insulating layer is problematic. It therefore may be necessary, in some embodiments, to protect the aluminum current collectors with thin film coatings. The coatings need to be electrically conductive, and non-corrosive when it is in contact with electrode active materials and electrolyte under the intended electrochemical environments. Two types of materials were considered: (1) metals/alloys such as nickel, Ti and Ti alloys, graphite and other carbon materials and composites. Noble metals such as Au, Pt and Ag can also be used, but their costs are too high for many applications. (2) conductive metal oxides such as nickel oxide, titanium dioxide, zinc oxide, aluminum doped zinc oxide, and indium tin oxide (ITO). Deposition of thin protective films of those metals/alloys, and metal oxides can be done according to such processes as chemical vapor deposition (CVD) including Atmospheric pressure CVD (APCVD), Low-pressure CVD (LPCVD), Ultrahigh vacuum CVD (UHVCVD), Microwave plasma-assisted CVD (MPCVD), Plasma-Enhanced CVD (PECVD), Combustion Chemical Vapor Deposition (CCVD), and Photo-initiated CVD (PICVD) and physical vapor deposition (PVD) including cathodic arc deposition, electron beam PVD, evaporative deposition, sputtering deposition, and pulsed laser deposition. Pulsed laser deposition was chosen for each of these materials. The ability of thin protective films to protect aluminum current collectors from surface oxidation and corrosion depends on the material nature of the thin films as well as the methods for depositing the thin films. The thickness, electrical conductivity, adhesion and density of the protective films that affect their protective ability are affected by the methods of deposition and processing parameters.

A series of protective materials including Ti, Ni, graphite, NiO, $TiO_2$, tin-doped indium oxide (ITO), and ZnO were deposited as the protective films on unkarstified Al foils of 250 μm thick by pulsed laser deposition (PLD). Those protective films were either deposited for short time (20 minutes, called "thin film" in FIG. 11) or long time (2 hours, call "film" in FIG. 11) using respective target materials in high vacuum (<2.5×10⁻⁷ torr, for metal and graphite films) or in oxygen gas atmosphere of 40 mtorr (for metal oxide films). The "thin film" has thickness in the range of 100-200 nm, which "film" has thickness of 0.6-1.2 μm. The laser beam ablated various target materials with laser energy density of ~3-5 J/cm² at room temperature to deposit protective films.

The protective film coated unkarstified Al surface was used as a current collector in contact with $MnO_2$ paste (consisting of 75% $MnO_2$, 15% Super C65 Carbon black and 10% PTFE binder, mass of $MnO_2$ paste 0.10 g) to form a positive electrode for the supercapacitor cell, and with activated carbon paste (consisting of 80% Picatif SuperCat PUI 4869 Activate Carbon, 15% Super C65 Carbon black and 5% PTFE binder, mass of paste 0.05 g) form the negative electrode. The electrode area was 20 mm×20 mm square. The supercapacitor cell was assembled by pressing the cathode, a gore separator and the anode between two stainless supported plates at a pressure of 9-10 pounds to form a typical button cell. The Carbon-$MnO_2$ asymmetric supercapacitor cell was then tested in the in 0.5 M $Na_2SO_4$ aqueous electrolyte.

Figure 11:
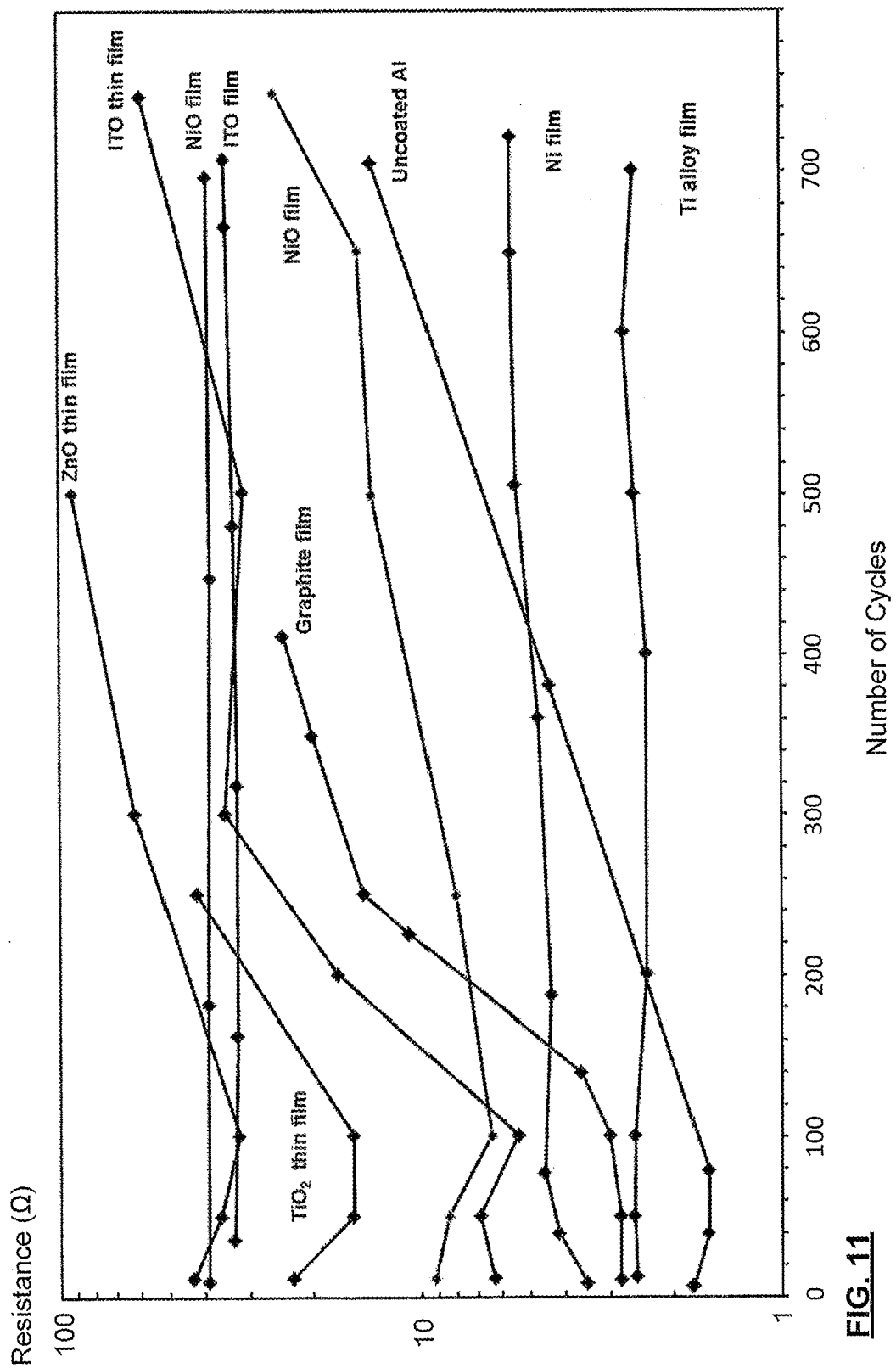
FIG. 11 is a multigraph showing resistance as a function of a number of charging-discharging cycles for activated carbon-$MnO_2$ asymmetric supercapacitors using unkarstified Al with various coatings in an aqueous electrolyte.

The cell resistance determined from galvanostatic charging-discharging (constant current 25 mA at 0.01 Hz) curves plotted as function of cycling number for all coating materials and the results are shown in the FIG. 11. The cells having Ti, Ni and graphite-coated aluminum current collectors have slightly higher cell resistance than the cells having un-coated aluminum current collector at the first couple of cycles since the conductivity of aluminum metal is lower than Ti, Ni and graphite. The cells having metal oxide-coated aluminum ("thin film" or "film") current collectors have much higher cell resistance than the cells with un-coated aluminum current collector at the first couple of cycles again due to much lower conductivity of metal oxides than that of aluminum metal.

It was found that the thicker the metal oxide is, the higher its initial resistance is. When the charging-discharging cycle number increased, the resistance of cells having un-coated aluminum current collector increased quickly and linearly and reached ~13.6 or ~54.4 Ω·cm² at 706 cycles. The resistance of cells with metal (Ti and Ni)-coated aluminum current collectors were only slightly changed and had values fluctuating near ~5 or ~20 Ω·cm² for Ni and ~2.5 or ~10 Ω·cm² for Ti. The resistance of cells having Graphite-coated Al current collectors increased much more quickly than that of bare Al and the value reached ~24 or ~96 Ω·cm² at 416 cycles. The resistance of cells having thick metal oxide (NiO and ITO)-coated aluminum current collector did not increase and almost kept constant at value of ~34.5 or ~22.4 Ω·cm² for ITO or ~39 or ~10.2 Ω·cm² for NiO throughout the ~700 cycles. The resistance of cells having thin metal oxide (NiO, ZnO, $TiO_2$ and ITO)-coated aluminum current collector increased rapidly with cycle number.

The results indicate that metal coatings (Ni and Ti) and thick metal oxide coatings (NiO and ITO) were able to protect aluminum current collectors from surface oxidation in the Carbon-$MnO_2$ asymmetric supercapacitor cell with 0.5 M $Na_2SO_4$ aqueous electrolyte. The metal oxide coatings, however, introduced high interfacial resistance due to their relatively poor electrical conductivity; therefore, they may not be as good as metal coatings. Graphite, in this study, did not show good protection for Al, although it has proven itself in other studies. Thin metal oxide coatings are found not to generally be suitable since they may not be thick enough to form a dense layer to protect aluminum from surface oxidation. From the above example, we conclude that the Al surface coated with Ti is best for the Carbon-MnO$_2$ asymmetric supercapacitor asymmetric cells in aqueous electrolyte. For other types of supercapacitors, such as symmetry activated carbon based supercapaciotors, using different electrolytes, such as strong acid or base aqueous electrolyte or organic electrolytes, other energy storage devices in general, may needed different coating materials as the protective films.

The performance improvement with a protective coating at the interface between active material and unkarstified Al current collector for energy storage devices such as supercacaitors is demonstrated above. It is also expected that similar performance improvement with a protective coating will also be applicable for the karstified Al foils.

Coated Karstified Al

Applicant has further investigated the coating of a karstified Al foil with Ti, and C. An Al foil um thick was karstified with an excimer laser that was not operating reliably, and therefore the details of the processing are not included here. The Ti coating was applied by PLD using the same chamber and same laser, and so the foil was karstified and coated in a single vacuum chamber, but the vacuum was removed to move the foil between the karstification and deposition positions. The Ti layer was estimated to be deposited to a thickness of 0.6-1.2 µm. The sample was tested as a current collector in an activated carbon MnO$_2$ asymmetric supercapacitor cell in 0.5 M Na$_2$SO$_4$ aqueous electrolyte. This electrochemical cell was subjected to impedance spectroscopy, 5000 cycles of galvanostatic testing, and then again to impedance spectroscopy, which indicated that the coated karstified current collector has reduced internal cell resistance in comparison with the unkarstified, uncoated Al reference button cell, and had lower change in internal resistance after the cyclic galvanostatic testing, than the uncoated, unkarstified reference.

Applicant has further investigated karstified Al foils with composite conductive coatings. A 25 µm thick Al foil was karstified by a Q-Switched Diode-Pumped Solid-State laser in vacuum using the following parameters: diode laser drive current 20 A; repetition rate 1000 Hz; power 0.101 w; pulse energy 101 µJ and energy density per pulse 0.034 J/cm$^2$. The composite film was deposited on the 25 µm thick Al foils by laser ablation in 10 mtorr of Ar gas using 3-5 J/cm$^2$ laser energy at repetition rate of 50 Hz for 40 minutes to achieve about 0.3-0.5 µm thickness. The composite coated and laser karstified 25 µm thick Al foils were used as current collectors, and were tested in supercapacitor cells. The preparation and assembly of electrode active materials, separator and electrochemical cells as well as testing procedure are exactly the same as for testing the karstified 50 µm thick Al foils described hereinabove. The laser karstified 25 µm thick Al foils without composite coating were used to assemble a control cell for comparison, and were otherwise identical. Impedance spectroscopy (using 10 mV amplitude and 10 mHz-0.2 MHz frequency) was used to analyze the internal resistance of the electrochemical cells. The composite coated, karstified Al current collectors had lower interfacial resistance than the karstified Al reference collector. A preliminary report of longevity testing has shown interface resistance and capacity stability to 10,000 cycles with the coating.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

The invention claimed is:

1. A method for producing a metal foil less than 0.5 mm thick, the metal foil having a karstified topography having a surface morphology in which a maximum peak height minus a maximum profile depth is greater than 0.5 µm and extends into the surface at least 5% of the foil thickness, a root mean square roughness is at least about 0.2 µm measured in a direction of greatest roughness, and an oxygen abundance is less than 5 atomic %, the method comprising:
    providing a metal foil with a thickness less than 0.5 mm, retained in place within a vacuum chamber;
    evacuating the chamber to a pressure less than 7×10$^{-3}$ Pa; and
    applying a high power laser radiation to the surface of the metal foil, the radiation having an irradiance sufficient to ablate the metal, leaving the karstified topography on the surface of the metal foil.

2. The method of claim 1 wherein:
    the surface morphology has a height distribution that is at least approximately Gaussian, a skewness less than +/−1.5, and a kurtosis in a range of 2-11;
    profiles of the surface morphology, defined as a height of the surface along a line segment in a plane of the surface, establish that a mean separation of peaks and valleys is less than 50 microns; or
    profiles of the surface morphology, defined as a height of the surface along a line segment in a plane of the surface, establish that at least 5% of the slope of the profiles are greater than 5 or less than −5.

3. The method of claim 2 wherein the maximum profile depth is at least 2% of the foil thickness.

4. The method of claim 3 wherein the foil is composed of a metal that naturally forms an oxide that has a higher electrical resistance than the metal, and the method further comprises applying a passivating layer onto the karstified topography, the passivating layer having a higher electrical conductivity and/or corrosion resistance than that of the oxide.

5. The method of claim 4 wherein applying the passivating layer comprises depositing the passivating layer in the vacuum chamber.

6. The method of claim 4 wherein applying the passivating layer comprises applying a physical vapour deposition (PVD) process.

7. The method of claim 4 wherein applying the passivating layer comprises applying a pulsed laser deposition process that uses a same laser as was used to produce the karstified topography.

8. The method of claim 4 wherein the foil is composed of Al, Ni, Ti, Cu, or stainless steel or an alloy or mixture of any two or more thereof, and the passivating layer is composed of one or more metals, one or more alloys, carbon, a carbon metal composite, or one or more metal oxides, or any combination of two or more thereof.

9. The method of claim 3 wherein providing the foil comprises mounting a foil to a reel-to-reel system within the vacuum chamber.

10. The method of claim 3 wherein the foil is 0.01-0.2 mm thick or 0.020-0.050 mm thick.

11. The method of claim 1 wherein applying a high power laser radiation pattern to the surface comprises:
- moving one or more lasers, or optical components for redirecting a beam from the one or more lasers, with respect to the surface to produce a time-varying high power electromagnetic radiation pattern;
- moving one or more lasers that are located outside of the vacuum chamber with respect to a window of the vacuum chamber;
- operating a short pulse, high energy laser with focusing optics to focus the energy to achieve high spatio-temporal focusing of the electromagnetic radiation;
- operating a femtosecond laser;
- operating a picosecond laser;
- operating a nanosecond laser;
- operating an eximer laser; or
- operating a Q-switched Nd-YAG solid state laser.

12. A metal foil less than 0.5 mm thick, the metal foil having a karstified topography having a surface morphology in which:
- a maximum peak height minus a maximum profile depth is greater than 0.5 µm and extends into the surface at least 5% of the foil thickness;
- a root mean square roughness is at least about 0.2 µm measured in a direction of greatest roughness; and
- an oxygen abundance is less than 5 atomic %.

13. The foil of claim 12 wherein profiles of the surface morphology, defined as a height of the surface along a line segment in a plane of the surface, establish that a mean separation of peaks and valleys is less than 50 microns.

14. The foil of claim 13 wherein the profiles establish that at least 5% of the slope of the profiles are greater than 5 or less than −5.

15. The foil of claim 12 wherein the surface morphology has a height distribution that is at least approximately Gaussian, has a skewness less than +/−1.5, and a kurtosis in a range of 2-11.

16. The foil of claim 12 wherein the foil is composed of a metal or alloy that resists corrosion and is electrically conductive.

17. The foil of claim 12 wherein the foil is composed of Al, an Al alloy, stainless steel, Cu, Ag, Ni, Ti, or a mixture or alloy of any two or more thereof.

18. The foil of claim 12 wherein the foil is coated with a metal, alloy, carbon, carbon metal composite or metal oxide that resists oxidation/corrosion and/or is electrically conductive.

19. The foil of claim 12 wherein the foil is composed of Al, an Al alloy, Cu, or a Cu alloy, and has a coating of a metal, alloy, carbon, carbon metal composite, metal oxide, or a combination of any two or more thereof.

20. The foil of claim 12 wherein the foil is composed of Al, an Al alloy, Cu, or a Cu alloy, and has a coating of nickel, a nickel alloy, titanium, a titanium alloy, carbon, a carbon metal composite, nickel oxide, titanium dioxide, zinc oxide, or indium tin oxide, or a mixture of any two or more thereof.

21. The foil of claim 12 wherein the foil thickness is less than 0.5 mm and the maximum peak height minus maximum profile depth is more than 5% of the foil thickness.

22. The foil of claim 12, the foil being comprised within an electrochemical interface and having a first face facing an active material, the first face bearing the karstified topography.

23. The foil of claim 22 wherein profiles of the surface morphology, defined as a height of the surface along a line segment in a plane of the surface, establish that a mean separation of peaks and valleys is less than 50 microns.

24. The foil of claim 23 wherein the profiles establish that at least 5% of the slope of the profiles are greater than 5 or less than −5.

25. The foil of claim 22 wherein the surface morphology has a height distribution that is at least approximately Gaussian, has a skewness less than +/−1.5, and a kurtosis in a range of 2-11.

26. The foil of claim 22 wherein the foil is composed of a metal or alloy that resists corrosion and is electrically conductive.

27. The foil of claim 22 wherein the foil is coated with a metal, alloy, carbon, carbon metal composite, or metal oxide that resists corrosion and is electrically conductive.

28. The foil of claim 22 wherein the foil is less than 0.5 mm thick, 0.01-0.2 mm thick, or 0.020-0.050 mm thick, and the maximum peak height minus maximum profile depth is 5-50% of the foil thickness.

29. The foil of claim 12 wherein the foil thickness is 0.01-0.2 mm and the maximum peak height minus maximum profile depth is more than 5% of the foil thickness.

30. The foil of claim 12 wherein the foil thickness is 0.020-0.050 mm and the maximum peak height minus maximum profile depth is more than 5% of the foil thickness.

* * * * *